(12) United States Patent
Sasaoka et al.

(10) Patent No.: US 6,800,801 B2
(45) Date of Patent: Oct. 5, 2004

(54) PHOTOVOLTAIC POWER GENERATING STRUCTURE

(75) Inventors: Makoto Sasaoka, Kyotanabe (JP); Yuji Inoue, Nara (JP); Satoru Shiomi, Kyotanabe (JP); Hidehisa Makita, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 153 days.

(21) Appl. No.: 09/315,018

(22) Filed: May 20, 1999

(65) Prior Publication Data

US 2001/0008143 A1 Jul. 19, 2001

(30) Foreign Application Priority Data

May 20, 1998 (JP) ............................................ 10-137306
May 19, 1999 (JP) ............................................ 11-138175

(51) Int. Cl.⁷ .............................. H01L 25/00; H02N 6/00
(52) U.S. Cl. ........................ 136/246; 136/244; 136/251; 136/252; 136/258; 136/261; 136/259; 52/173.3; 126/621; 126/622; 126/623; 126/625; 126/648
(58) Field of Search .................................. 136/244, 246, 136/251, 252, 258, 261, 259; 52/173.3; 126/621, 622, 623, 625, 648

(56) References Cited

U.S. PATENT DOCUMENTS

| | | | | |
|---|---|---|---|---|
| 3,994,276 A | * | 11/1976 | Pulver ......................... | 126/270 |
| 4,111,359 A | * | 9/1978 | Trombe et al. .............. | 237/1 A |
| 4,315,163 A | * | 2/1982 | Bienville ...................... | 307/66 |
| 4,392,009 A | * | 7/1983 | Napoli ......................... | 136/251 |
| 4,677,248 A | * | 6/1987 | Lacey .......................... | 136/244 |
| 5,092,939 A | * | 3/1992 | Nath et al. ................... | 136/251 |
| 5,444,798 A | | 8/1995 | Enomoto et al. ........... | 382/199 |
| 5,480,494 A | * | 1/1996 | Inoue .......................... | 136/251 |
| 5,500,055 A | * | 3/1996 | Toyama et al. .............. | 136/259 |
| 5,505,788 A | | 4/1996 | Dinwoodie .................. | 136/246 |
| 5,589,006 A | * | 12/1996 | Itoyama et al. ............. | 136/248 |
| 5,651,837 A | * | 7/1997 | Ohtsuka et al. ............. | 136/251 |
| 5,740,996 A | * | 4/1998 | Genschorek ................. | 248/237 |
| 6,018,123 A | | 1/2000 | Takada et al. ............... | 136/248 |
| 6,063,996 A | * | 5/2000 | Takada et al. ............... | 136/246 |

FOREIGN PATENT DOCUMENTS

| | | | | |
|---|---|---|---|---|
| EP | 0 762 514 A2 | 3/1997 | | |
| EP | 0 824 273 A2 | 2/1998 | | |
| JP | 4 33340 | 5/1990 | | |
| JP | 7 29208 | 4/1994 | | |
| JP | 409119202 A | * | 5/1997 | ........... E04D/13/18 |
| JP | 9-223814 | 8/1997 | | |

* cited by examiner

*Primary Examiner*—Harold Pyon
*Assistant Examiner*—Michael C. Miggins
(74) *Attorney, Agent, or Firm*—Fitzpatrick, Cella, Harper & Scinto

(57) ABSTRACT

There is disclosed a photovoltaic power generating structure in which a solar cell module is arranged on a base member, wherein a closed space portion cut off from the air is provided between the base member and the solar cell module. Thus, there can be provided a photovoltaic power generating structure which can be easily constructed at a low installation cost, can maintain a good output as a photovoltaic power generating system, is excellent in environmental resistance, and can improve fireproofness.

28 Claims, 15 Drawing Sheets

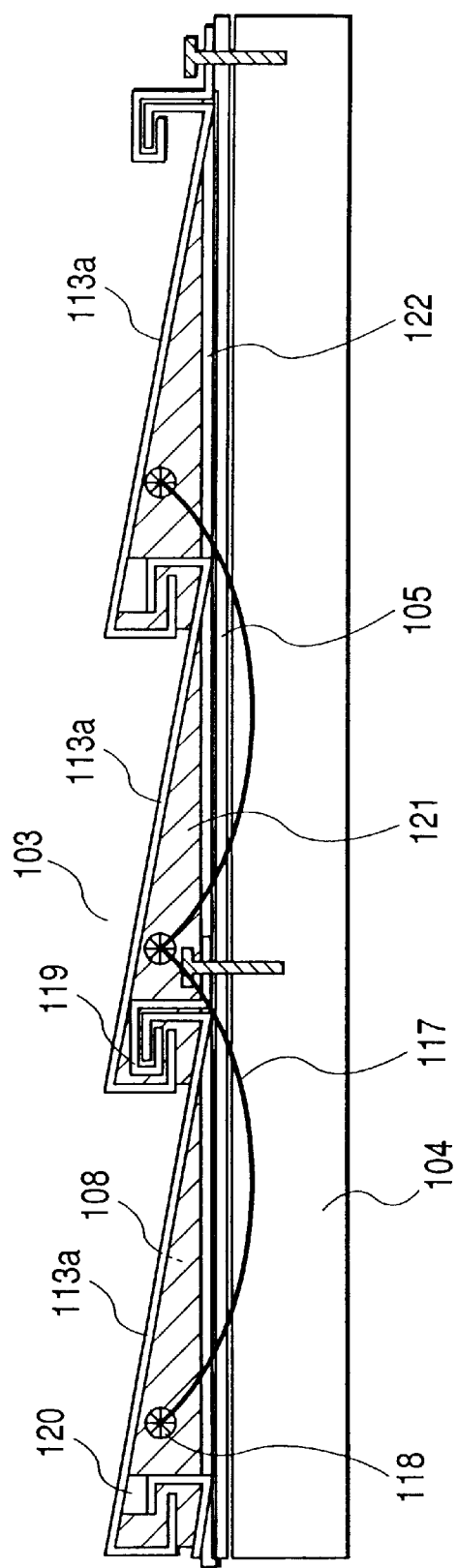

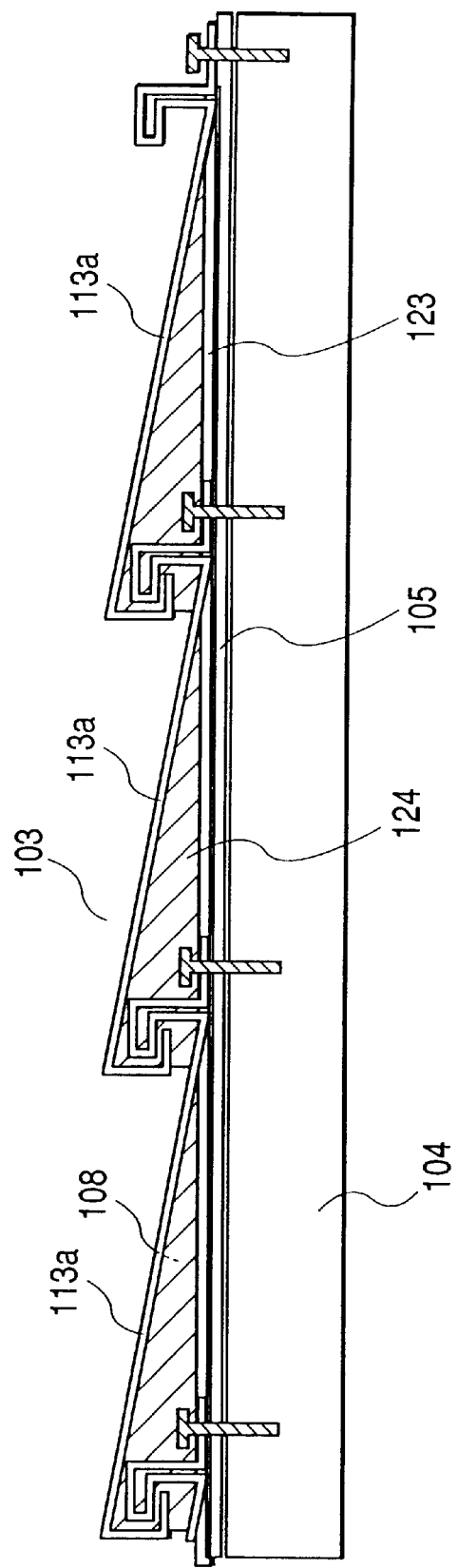

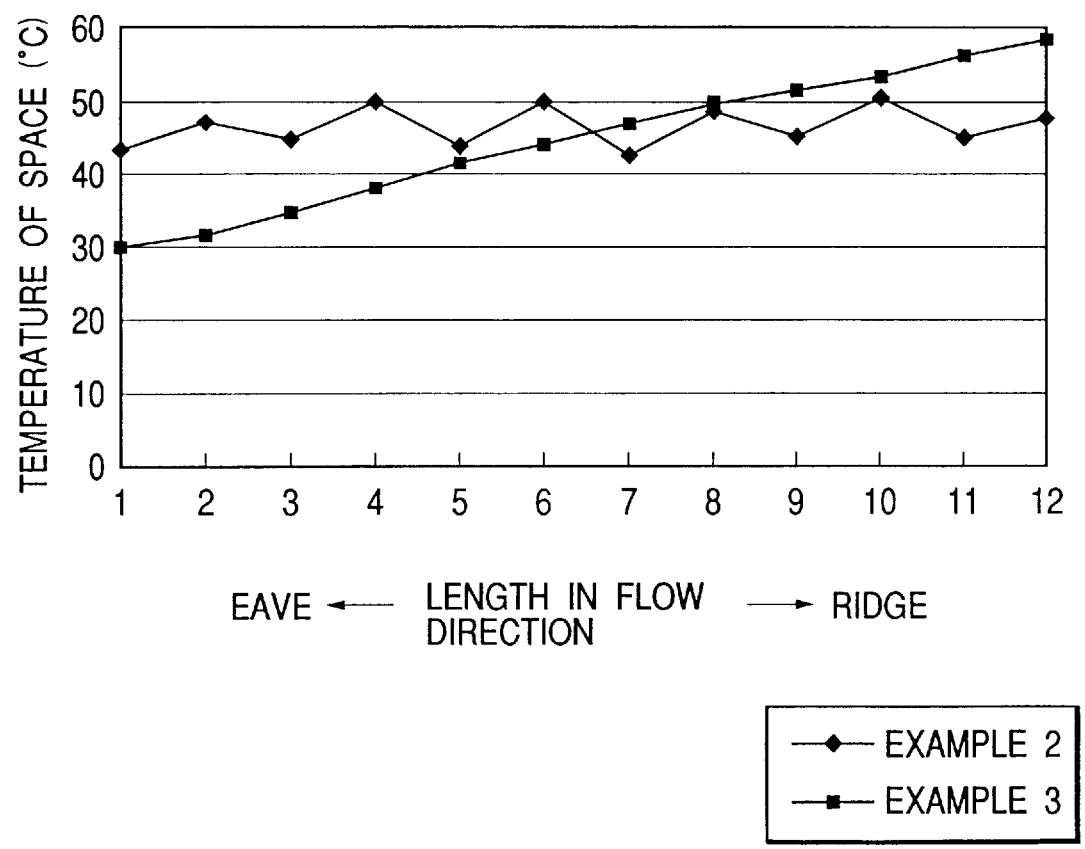

PHOTOVOLTAIC POWER GENERATING STRUCTURE

BACKGROUND OF THE INVENTION

Field of the Invention

The present invention relates to a photovoltaic power generating structure using solar cell modules, and more particularly, it relates to a photovoltaic power generating structure which can be formed as a photovoltaic power generating roof having a thermal insulating space portion not communicating with the air on the back surface of each solar cell module.

In recent years, much attention has been paid to the earth's environmental problems, and the expectations for solar cells which are clean energy sources are increasing more and more. In this connection, various kinds of photovoltaic power generating systems have been suggested and put to practical use. Usually, the above-mentioned photovoltaic power generating system mainly comprises a plurality of solar cell modules arranged on the roof of a house, a junction box electrically connected to the solar cells, and an inverter.

The above-mentioned solar cell modules can be classified into a module using amorphous silicon-based semiconductors and a module using crystalline silicon-based semiconductors. The solar cell module using the amorphous silicon-based semiconductors fundamentally has a lower power generating efficiency than the solar cell module using the crystalline silicon-based semiconductors and, moreover, exhibits a phenomenon (the Staebler-Wronski phenomenon) in which, when irradiated with light for a comparatively short period, a generated output is lower than a generated output in an initial state and is thereafter maintained. Accordingly, in order to obtain the same generated output as in the solar cell module using the crystalline silicon semiconductors, a large light receiving area is required.

This phenomenon of deteriorating power, i.e., light degradation, however, can be depressed by keeping photovoltaic elements at a temperature which is higher than the ambient temperature by 20 to 150° C. At the same time, once degraded performance is known to be restored, the phenomenon, known as the annealing effect, provides an effect depending on the temperature.

Usually, solar cell modules are arranged as lifted and constantly spaced on roof tiles or roof base members, so that solar cell modules which employ amorphous semiconductors considerably rise in temperature due to irradiation with sunlight. However, they cannot gain the benefit of the annealing effect due to heat radiation from both the upper and lower surfaces of the modules.

To guard against this, there is a method available whereby the surfaces of the solar cell modules opposite the light receiving surfaces are provided with a thermal insulator or a thermal insulating portion, to obtain the annealing effect sufficiently.

For example, Japanese Patent Application Laid-Open No. 7-292908 employs such a roof construction that the surfaces of the solar cell modules opposite the light receiving surfaces are in contact with thermal insulating materials.

Furthermore, Japanese Patent Application Laid-Open No. 4-33340 employs such a roof construction that solar cell modules and a roof surface plate have a thermal insulating space portion formed therebetween.

The prior art photovoltaic power generating structures have the following problems.

In the case of a roof construction where the surfaces of the solar cell modules opposite the light receiving surfaces are in contact with thermal insulating materials as shown in Japanese Patent Application Laid-Open No. 7-292908, cost effectiveness is problematic. That is to say, to obtain the annealing effect sufficiently, it is necessary to employ thermal insulating materials having a low thermal transmittance, thereby increasing the material costs. It is impossible to prevent thermal radiation from the lower surface of the solar cell modules depending on the thermal conductivity and the thickness of the thermal insulating material employed, resulting in insufficient annealing effect. Moreover, additional costs may be incurred to install the thermal insulating material.

While on the other hand, a roof structure wherein a thermal insulating space portion is formed between the solar cell modules and the roof surface plate such as described in Japanese Patent Application Laid-Open No. 4-33340 has the following two problems.

First, there is a problem due to convection within the thermal insulating space portion. Inside the thermal insulating space portion there are gaps for wiring and the like, even when the portion seems to be finely partitioned by the retaining clips or the like of the solar cell modules. When the air in the thermal insulating space portion is warmed, the air is circulated by convection to the ridge side, resulting in different temperatures in the respective solar cell modules, which leads to fluctuations in total power as a photovoltaic power generating system, as well as light degradation of each solar cell module and nonuniformity in the annealing effect.

Second, there is a problem due to wind. The thermal insulating space portion is in communication with the open air, so that the solar cell modules are subject to upward dashing wind. In order to prevent the solar cell modules from being blown even with strong wind, the solar cell modules must be strengthened greatly.

In view of these problems, an object of the present invention is to provide a photovoltaic power generating structure that is easy to construct, inexpensive to install, able to maintain a good power level as a photovoltaic power generating system, excellent in environmental resistance, and hence improved in fire-resistant properties.

SUMMARY OF THE INVENTION

To achieve the above-mentioned objects, a photovoltaic power generating structure according to the present invention comprises a base member on which a solar cell module is arranged in such a way that there is provided a closed space portion interrupted in communication with (i.e., not communicating with or cut off from) the air, between the base member and the solar cell modules. In this case, there exists air or the like in the closed space portion. In the specification and claims, the closed space portion will be sometimes referred to as the "thermal insulating space portion". However, it is not necessary that the thermal insulating space portion completely insulates heat, as long as it has at least substantially the same thermal insulating performance as that of the air.

In the constitution of the solar cell structure, it is preferred that an underlaying material is provided on the base member.

Furthermore, it is preferable that the closed space portion should be divided into a plurality of partitions by a convection controlling portion and that each partitioned space portion is interrupted in communication with each other.

The convection controlling portion should preferably be arranged in the direction of the purlin so that each space portion may be interrupted in communication in the direction of flow of the roof (i.e., the direction of slope of the roof, or the direction perpendicular to the direction of the purlin; hereinafter sometimes referred to as the "flow direction") with each other.

Moreover, the convection controlling portion should preferably be formed of a noncombustible material.

Alternatively, the convection controlling portion may serve also as a retaining clip to fix the solar cell modules.

Furthermore, the solar cell modules should preferably be of the lateral roofing type so that each space portion may be interrupted in communication in the flow direction with each other.

The underlaying material should preferably be a material having a softening point of 40° C. to 90° C.

Moreover, the underlaying material should preferably be excellent in thermal insulation performance.

In addition, the solar cell modules should preferably be formed into roofing material integrated type solar cell modules.

Further, it is preferred that the photovoltaic power generating structure comprises a non-power-generating roof portion in addition to the solar cell module.

In addition, the solar cell modules should preferably be formed of amorphous silicon-based semiconductors.

Also, the solar cell modules should preferably be connected to an inverter which controls the power of the modules or to a junction box.

BRIEF DESCRIPTION OF THE DRAWINGS

FIG. 15 is a schematic sectional view showing the photovoltaic power generating structure of Example 5;

FIG. 16 is a schematic sectional view showing the photovoltaic power generating structure of Example 6; and FIG. 17 is a graph showing the relationship between the points in the flow direction and the temperature distribution in Examples 2 and 3.

DESCRIPTION OF THE PREFERRED EMBODIMENTS

Figure 1A:
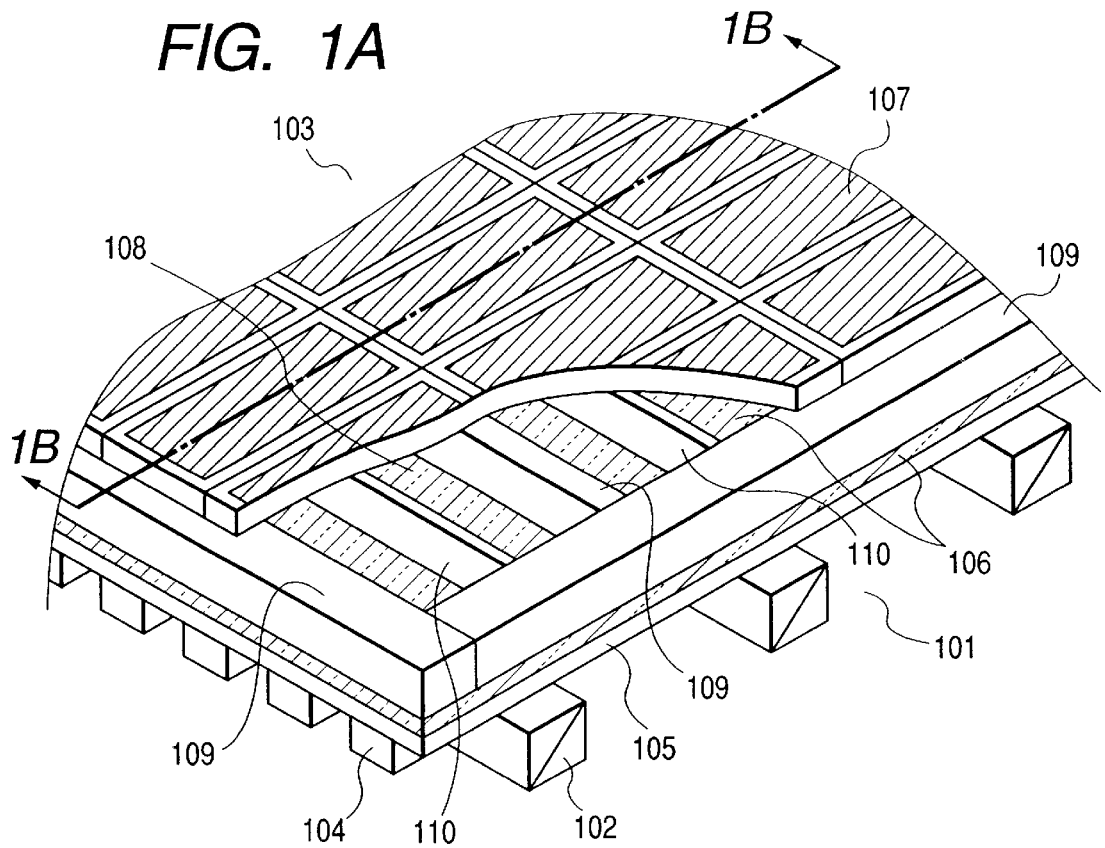
FIG. 1A is a schematic structural view showing an embodiment of the photovoltaic power generating structure of the present invention.

According to the present invention, such a construction is provided that on the base member, such as a roofing base member, are arranged solar cell modules and, between the base member and the solar cell modules is provided a thermal insulating space portion (closed space portion) interrupted in communication with the air. The air within the thermal insulating space portion becomes substantially stationary; since the stationary air has an extremely low thermal transmittance, it will prevent heat radiation from the lower surface of the solar cell modules, thus obtaining the annealing effect sufficiently even when amorphous semiconductors are employed as solar cell modules.

This construction provides a lower thermal transmittance and greater annealing effect than the construction where the same thickness of thermal insulating materials are employed. Also, since the thermal insulating space portion is not in communication with the air, the solar cell modules are not subject to upward dashing wind, thereby eliminating the need for a highly strengthened structure for installing solar cell modules.

Moreover, this construction, not being in communication with the air, is advantageous in that the base member will not easily catch fire even when it is heated by flying kindling coal on, for example, the roof at the time of fire.

In this construction, when the thermal insulating space portion provided between the base member and the solar cell modules is divided into a plurality of space partitions, and when the thus partitioned space portions are interrupted in communication with each other, convection is controlled within the thermal insulating space portion to reduce unevenness in the temperature between the respective solar cell modules. This results in controlling power fluctuations, light degradation, and annealing effect nonuniformity to prevent the total power of the photovoltaic power generating system from deteriorating. The larger the number of these partitions of the thermal insulating space portion, the greater the effects.

Also, when the convection controlling portion is arranged in the direction of the purlin to interrupt communication in the flow direction of the space portion, air warmed in the thermal insulating space portion is prevented from flowing toward the eaves (i.e., convection), further improving the effects. Also, since there are a plurality of convection controlling portions, even if some of them are damaged by fire, etc., the remaining ones will serve to control convection.

When the convection controlling portions are made of a noncombustible material, each space portion is partitioned by the noncombustible material; it is all the more effective in preventing the spread of fire, etc. When the lower surfaces of the solar cell modules are made of noncombustible material, the effects become much more pronounced.

Alternatively, when the convection controlling portion serves also as a retaining clip, the above-mentioned effects can be obtained only by construction thereof.

That is to say, when the solar cell modules are of the lateral roofing type, the seam joint portions extending in the direction of the purlin come into contact with the roofing base member or underlaying material, thus serving as the convection controlling portion. The effects are greater when the roofing underlaying material has a lower softening point. Therefore, it becomes possible to provide such a constitution that communication in the flow direction of space portions with each other is interrupted.

The underlaying material should preferably have a softening point of 40° C. to 90° C. because under a burning sun, the roofing material integrated solar cell modules significantly rise in temperature.

Setting the softening point at such a temperature can easily increase the airtightness of the closed space portion formed by mounting the solar cell module.

With the base member or underlaying material having excellent thermal insulation, the thermal transmittance of the thermal insulating space portion and the base member or underlaying material becomes low, thus preventing heat radiation from the lower surface of solar cell modules and, at the same time, allowing an increase in the temperature inside the thermal insulating space portion, resulting in improved annealing effect.

Further, by forming the solar cell module as the roofing material integrated type solar cell module, it becomes easy to apply the module to a roof of a house. The photovoltaic power generating structure may be a photovoltaic power generating structure (roof) which comprises a non-power-generating roof portion in addition to the solar cell module, and it is preferred that the solar cell module is formed of amorphous silicon-based semiconductor from the viewpoint of the obtainability of sufficient annealing effect as mentioned above. In this regard, it should be noted that even other types of solar cell modules using crystalline silicon-based semiconductors or the like can have almost the same effects on strong wind or fire as described above.

Also, when the solar cell modules are connected to an inverter to control the power thereof or to a junction box, they can function as a photovoltaic power generating system effectively.

The invention is further described in detail with respect to specific preferred embodiments by reference to the attached drawings, but the following embodiments are given for the purpose of illustration and not by way of limitation.

Figure 1B:
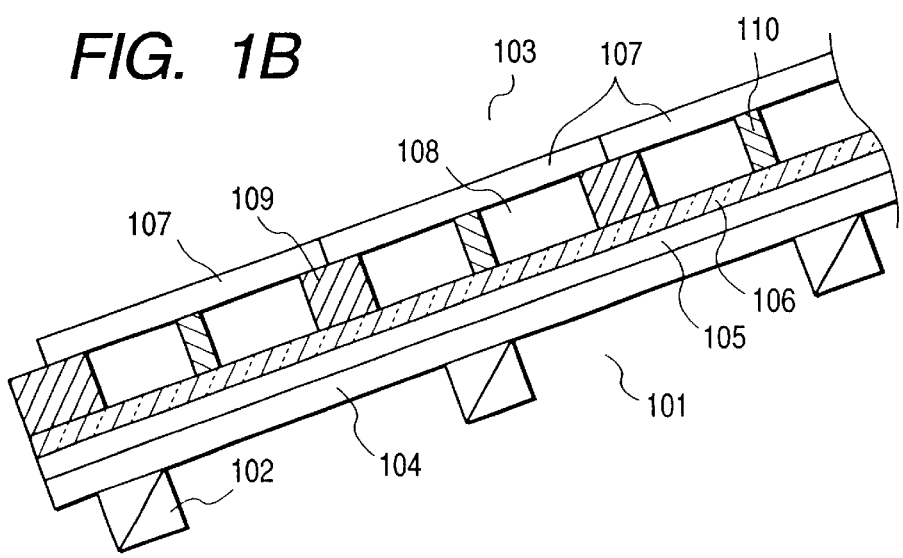
FIG. 1B is a schematic sectional view taken along the line 1B—1B of FIG. 1A.

FIG. 1A is a schematic structural view showing an embodiment of the photovoltaic power generating structure of the present invention, and FIG. 1B is a schematic sectional view taken along the line 1B—1B of FIG. 1A.

In FIGS. 1A and 1B, above a house 101 there are arranged in parallel a plurality of purlins 102 in a direction perpendicular to the flow direction of a roof 103. On the purlins 102 there are arranged in parallel a plurality of rafters 104 from the uppermost purlin 102 to the lowermost purlin 102 in the flow direction.

On the rafters 104 are arranged a sheathing roof board 105 as the base member and an underlaying material 106 all over the roof 103; on the underlaying material 106 are arranged a plurality of solar cell modules 107 fixed with retaining clips 109. Between the solar cell modules 107 and the underlaying material 106 is formed a thermal insulating space portion 108 interrupted in communication with the air.

With this constitution, fire, for example, can be prevented from spreading because the sheathing roof board 105 or the underlaying material 106, even if extremely heated, will not easily catch fire.

The thermal insulating space portion 108 is divided into a plurality of space portions by convection controlling portions 110, each of the space portions being interrupted in communication with each other, to control unevenness in the temperature between the respective solar cell modules 107. When amorphous silicon-based semiconductors are used as the solar cell modules, the annealing effect can also be controlled in nonuniformity. Also, since the space portions are interrupted in communication with each other by the plurality of convection controlling portions 110, even if some of the controlling portions are damaged by fire, etc., the remaining convection controlling portions sufficiently serve to control convection, thus preventing the spread of fire.

When the convection controlling portions 110 used in the present example are arranged in the direction of the purlins, the above-mentioned unevenness and nonuniformity are controlled. When the convection controlling portions 110 are formed of a noncombustible material, fire-resistant effect is improved.

Also, the convection controlling portions 110 can serve as the retaining clips 109 for the modules; when the solar cell modules 107 are of the lateral roofing type, the seam joint portions extending in the direction of the purlins come into contact with the roofing underlaying material 106, thus also serving as the convection controlling portions 110.

It is preferred that the underlaying material 106 has waterproofness, weather resistance, air permeability, moisture conditioning and heat insulation properties, or the like. Specifically, as the underlaying material 106, there can preferably be used the asphalt type roofings such as asphalt roofings or modified asphalt roofings, the polyvinyl chloride type resin roofings, the polyester type resin roofings, the polyethylene type resin roofings, the polystyrene type resin thermal insulating materials, the polyurethane type resin thermal insulating materials, and so on.

Further, such an underlaying material may be omitted and the base member such as a sheathing roof board itself may be in contact with the thermal insulating space portion 108.

These roofing materials are excellent in heat insulation, which results in a further rise in the temperature inside of the thermal insulating space portion 108. Thus, when an amorphous silicon type semiconductor is used for the solar cell module 107, there can be obtained the effect of preventing deterioration of the performance of the solar cell module 107 by the annealing effect.

Especially, a dark color plate as the back surface reinforcing plate of the amorphous silicon type semiconductor makes the effect remarkable and is more preferable.

Of the materials mentioned above, with respect to waterproofness, workability, air permeability, weather resistance, cost, heat insulation property, or the like, the asphalt type roofings such as asphalt roofings or modified asphalt roofings are preferable.

In particular, the asphalt roofings are excellent in heat insulation and are therefore excellent in the effect of preventing deterioration of the performance of the solar cell module 107 by the annealing effect. The excellent heat insulation property of the roofing materials also reduces the influence on the temperature of the interior.

(Photovoltaic Element)

There are no specific restrictions on the photovoltaic elements used in the photovoltaic power generating structure of the present invention. As the silicon semiconductors, there can be used monocrystalline silicon photovoltaic elements, polycrystalline silicon photovoltaic elements, amorphous silicon photovoltaic elements, and so on. As the compound semiconductors, there can be used Group III-V compound photovoltaic elements, Group II-VI compound photovoltaic elements, Group I-III-VI compound photovoltaic elements, and so on.

Further, when a weather-resistant film, not a glass sheet, is used as the surface protecting material for the solar cell module, and when a metal sheet such as one used for the metal roof is used as the back surface reinforcing material, the solar cell module can be bent in the same shape as the metal roof and can therefore be shaped, for example, in the folded plate shape, the batten seam shape, or the horizontal-roofing shape.

With the conventional solar cell module using glass as a surface protecting material, and when the module itself is mounted on a structure such as a base member, it is essential to provide an intermediate member, such as a frame, between the solar cell module and the structure. However, the solar cell module of the structure in which the amorphous silicon type semiconductors with the electrically conductive substrates are sandwiched between a weather-resistant film and a metal sheet back surface reinforcing member can be installed directly on the base member, thus providing a full-fledged, building material integrated solar cell module.

Further, since the solar cell module of this type can also function as a metal roof, the total cost can be low, it can be processed in the similar shape to the conventional metal roof in terms of appearance, and freedom of design can be increased without posing a sense of incompatibility with the existing buildings.

Further, since the solar cell module of this type does not use glass as the surface protecting material, the weight of the solar cell module can be reduced. In addition, since it is not necessary to use the intermediate member such as a frame, the weight of the roof itself is decreased. Accordingly, damage can be reduced in the event of an earthquake and the like.

(Base Member)

The base member used in the present invention is used for the purpose of structurally supporting the cladding assembly, such as the roof or the wall, and for the purposes of thermal insulation and so on, and is a material located inside the outermost cladding assembly.

Although there are no specific restrictions on the base member used in the present invention, there can be used, for example, narrow Japanese cedar boards, plywood, rigid cemented chip boards, high-pressure cemented excelsior boards, particleboard, mortar, or the like.

(Underlaying Material)

When use of only the base member such as a sheathing roof board cannot attain sufficient waterproofness, it is preferred to provide an underlaying material on the base member to compensate the waterproofness. As the underlaying material, there are included sheet-like materials, board-like materials, foamed plastic products, and so on.

There are no specific restrictions on the underlaying material used in the present invention, but those underlaying materials are preferred which are comprised of the above-mentioned asphalt type roofing, polyvinyl chloride type resin roofing, polyester type resin roofing, polyethylene type resin roofing, polystyrene type resin thermal insulating material, or polyurethane type resin thermal insulating material, taking account of waterproofness, durability, cost, and general purpose properties.

Specifically, such materials are exemplified by, but not limited to, the following. Examples of the thermal insulating materials include "polystyrene foam (of a board shape)," "hard polyurethane foam (of a board shape)," and so on.

There are two types of polystyrene foam (of the board shape). The type depends upon the production process, i.e., one-shot foam by a continuous extrusion foaming (extrusion polystyrene foam) and two-shot foam by a fusion molding of beads of one shot foam (bead-process polystyrene foam). There can be used, for example, "Kanelite Foam" and "Baritac" (trade names) available from KANEKA CORP., "Styrofoam" (trade name) available from DOW KAKOH K.K., "Mirafoam" (trade name) available from JSP Corp., "Esren Foam" (trade name) available from Sekisui Plastics Co., Ltd., and so on.

The "hard polyurethane foam (of the board shape)" is generally a thermal insulating material obtained by molding a foam body resulting from a chemical reaction of polyol, isocyanate, and a foaming agent, into a board shape, and has a small thermal conductivity and high thermal insulating properties due to the use of a flown gas as a foaming agent.

Specific products include a sandwich-like foam in which urethane resin is foamed in a plate shape of a predetermined thickness between two sheet members by making use of the adhesive property of the urethane resin, a urethane foam shaped by cutting out of a large block, and so on.

There can be used, for example, "Everlite Panel" and "Everlite Board" (trade names) available from BRIDGE-STONE CORP., "Achilles Board" and "Achilles Hinon" (trade names) available from Achilles Corp., "Foam Lite" and "Thermax" (trade names) available from INOAC CORPORATION, "Kuran Panel" (trade name) available from KURABO INDUSTRIES LTD., "Soflan Panel" (trade name) available from Toyo Rubber Co., Ltd., "Iso Band" (trade name) available from DAIDO STEEL SHEET CORP., and so on.

As the sheet materials, there can be used specifically "asphalt roofing materials," "improved asphalt type materials," "synthetic resin type materials," and so on.

The "asphalt roofing materials" can be an asphalt roofing and an asphalt felt.

The former is obtained by impregnating a special paper sheet called a roofing base paper with straight asphalt and applying blown asphalt onto the surface thereof. Examples of the asphalt roofing that can be used in the present invention include "Mitsuboshi Asphalt Roofing" (trade name) available from TAJIMA ROOFING CO., LTD., "Asphalt Roofing" (trade name) available from Nanaou Kogyo K.K., "Asphalt Roofing" (trade name) available from NISSHIN KOGYO CO., LTD., and so on.

The latter is obtained by impregnating the roofing base paper with straight asphalt and examples thereof include "Mitsuboshi Asphalt Felt" (trade name) available from TAJIMA ROOFING CO., LTD., "Asphalt Felt" (trade name) available from Nanaou Kogyo K.K., "Asphalt Felt" (trade name) available from NISSHIN KOGYO CO., LTD., and so on.

The "improved asphalt type materials" are materials obtained by blending an appropriate amount of a synthetic rubber or synthetic resin compatible with asphalt, into the asphalt, thereby modifying the asphalt so as to enhance low-temperature characteristics, high-temperature characteristics, nail hole sealability, stickiness, durability, and so on. Examples of such improved asphalt type materials include a material obtained by using nonwoven fabric of a synthetic fiber as a reinforcing material and applying the improved asphalt onto the both surfaces or either one surface thereof, a material obtained by laminating the improved asphalt between two fibrous sheets, and so on.

Examples of such materials that can be used in the present invention include "Underroof K," "Liner Roofing," "Undergumlon MG base M," "Undergumlon MG base F," "Undergumlon MG base B," and "Home Roof" (trade names) available from TAJIMA ROOFING CO., LTD., "Morasun No. 1," "Morasun No. 2," "Morasun Ace," "Bester No. 1," "Bester No. 2," "Morasun ALC," and "Morasun No. 3" (trade names) available from Nanaou Kogyo K.K., "Color House Roof," "Ban Color Roof," "House Roof No. 2," "House Roof No. 3," and "Custom SA" (trade names) available from NISSHIN KOGYO CO., LTD., "Yane Roof," "Aquacut RR2100," "Aquacut SS15R," "Aquacut SS20I," and "Aquacut ZR20T" (trade names) available from Ube Industries, Ltd., "Superbird G520" and "Superbird G220" (trade names) available from Shizuoka Rekisei Kogyo K.K., "Toho GA Roof B-3," "Toho GA Roof B-4," "Toho GA Roof B-5," and "Toho GA Roof B-10" (trade names) available from Toho Perlite K.K., "Mikeron Shitaji Sheet 2000" and "Mikeron Shitaji Sheet 3000" available from HAYAKAWA RUBBER CO., LTD., and so on, but it is noted that the materials are not limited to these examples.

Further, the "synthetic resin type materials" are, for example, polyvinyl chloride, and it can be used in the form of a sheet alone or in the form of a lamination with another material (kraft paper, nonwoven fabric, asphalt, coal tar, asphalt felt, etc.).

Specific examples of the synthetic resin type materials include "Hitonton," "Hi Guard," and "Full Best Sheet" (trade names) available from Matsushita Electric Works, Ltd., "Sunroof King" and "Sunroof Kakiita" (trade names) available from Sunroof Kogyo K.K., "Suntac Roof TY" (trade name) available from HAYAKAWA RUBBER CO., LTD., "Tipec" available from Du Pont Japan LTD., "Nitoroof," "Zenten Sheet GR," and "Zenten Sheet GRA" (trade names) available from NITTO DENKO CORP., and "Dohtomi Champion" (trade name) available from TOTO SPACE LTD.

The foamed plastic products are used to achieve thermal insulation, prevention of dew condensation, or insulation of rain sound. Examples thereof that can be used include "Mirawoody" (trade name) available from JSP Corp., "Asfoam II" (trade name) available from TAJIMA ROOFING CO., LTD., "Banmatt No. 1" (trade name) available from NISSHIN KOGYO CO., LTD., "Foamnard Panel" (trade name) available from NICHIAS CORP., "Yukaroof" (trade name) available from Yuka Roof K.K., and so on.

EXAMPLES

The present invention will be described in further detail with examples thereof, but it should be noted that the present invention is by no means intended to be limited to these examples.

Example 1

The present example is an example showing the structure of a terminal extraction box to be covered on an electrode extraction portion of a solar cell module constructed by connecting in series the amorphous silicon type photovoltaic elements made on a stainless sheet substrate and encapsulating them with a weather-resistant resin with a GALUVALUME (trade name of an aluminum zinc alloy coated steel sheet) steel sheet provided on the back surface. The details will be described below.

Figure 2:
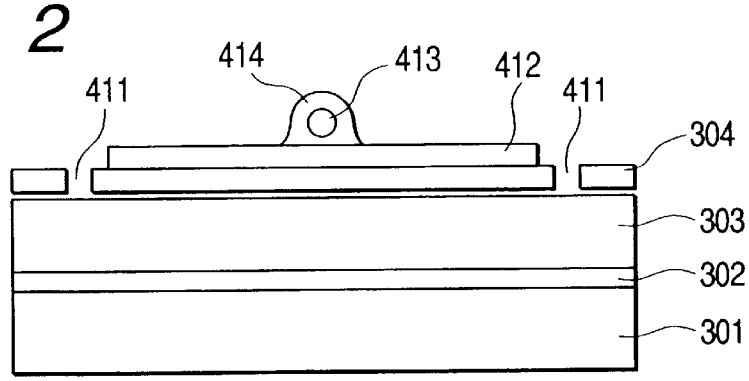
FIG. 2 is a schematic sectional view showing the amorphous silicon-based photovoltaic element of Example 1.
Figure 3:
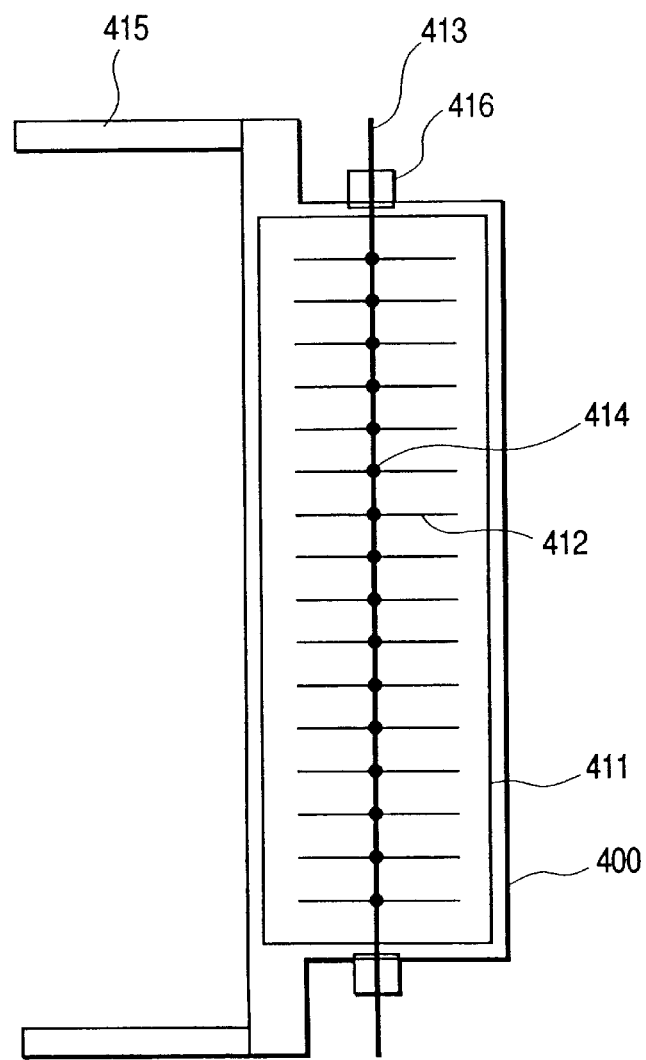
FIG. 3 is a schematic plan view showing the amorphous silicon-based photovoltaic element of Example 1.

The procedures for producing amorphous silicon type photovoltaic elements will be first described referring to FIGS. 2 and 3, in which FIG. 2 is a sectional view of the amorphous silicon type photovoltaic element and FIG. 3 is a plan view of the amorphous silicon type photovoltaic element.

First, on a cleaned long stainless steel substrate (electroconductive substrate) 301 of a roll shape having a thickness of 0.1 mm, a layer of Al containing 1% of Si (back surface reflecting layer) 302 was formed in a thickness of 5000 Å by sputtering by use of a film forming apparatus of the roll to roll system.

Then an nip-type amorphous silicon semiconductor layer (semiconductor layer) 303 was formed in such a way that an n-type semiconductor layer, an i-type semiconductor layer, and a p-type semiconductor layer were successively formed 300 Å, 4000 Å, and 100 Å thick, respectively, by the plasma CVD method using a film forming apparatus of the roll to roll system, by using gases of $PH_3$, $SiH_4$, and $H_2$ for the n-type semiconductor, gases of $SiH_4$ and $H_2$ for the i-type semiconductor, and gases of $B_2H_6$, $SiH_4$, and $H_2$ for the p-type semiconductor.

After that, a layer of ITO (transparent conductive layer) 304 was formed in a thickness of 800 Å by resistance heating evaporation, thereby forming the amorphous silicon type photovoltaic element.

Then the long photovoltaic element made as described above was punched into the shape as illustrated in FIG. 3 by use of a press machine, thereby making a plurality of solar cell strips 400. In the cut surfaces of the solar cell strips 400 thus formed by the press machine, the photovoltaic element was crushed to bring about a short circuit between the ITO electrode 304 and the stainless steel substrate 301.

For repairing the short circuit, an isolation section 411 was thus next provided around the ITO electrode 304 of each photovoltaic element as illustrated in FIGS. 2 and 3. This isolation section 411 was used for removal of the peripheral part of the ITO electrode.

The removal was carried out specifically as follows. First, an etchant having such etch selectivity as to dissolve ITO but not to dissolve the amorphous silicon semiconductors (e.g., $FeCl_3$ solution) was screen-printed around ITO electrode 304 slightly inside the cut surface of each solar cell strip 400 to dissolve ITO. Then each strip was cleaned with water to form the isolation section 411 around the ITO electrode 304.

Then a silver paste containing a binder of polyester resin ("5007" available from Du Pont Company) was screen-printed as grid electrodes 412 for collection of electricity on the ITO electrode 304.

Further, a tin-plated copper wire 413 as a collector electrode for the grid electrodes 412 was placed perpendicularly to the grid electrodes 412.

After that, "C-220" available from EMERSON & CUMING, INC., as adhesive silver ink 414 was dropped onto intersecting points of the tin-plated copper wire 413 with the grid electrodes 412 and then was dried at 150° C. for 30 minutes, thereby connecting the grid electrodes 412 with the tin-plated copper wire 413. On that occasion, polyimide tape 416 was attached to a part-beneath the tin-plated copper wire 413 in order to prevent the tin-plated copper wire 413 from contacting the end faces of the stainless steel substrate, as shown in FIG. 3.

Then parts of the ITO layer/a-Si layer in the non-power-generating region were removed by a grinder in the above solar cell strip having the amorphous silicon type photovoltaic elements to expose the stainless steel substrate. Thereafter copper foils 415 were welded to the exposed portions by a spot welder.

Figure 4:
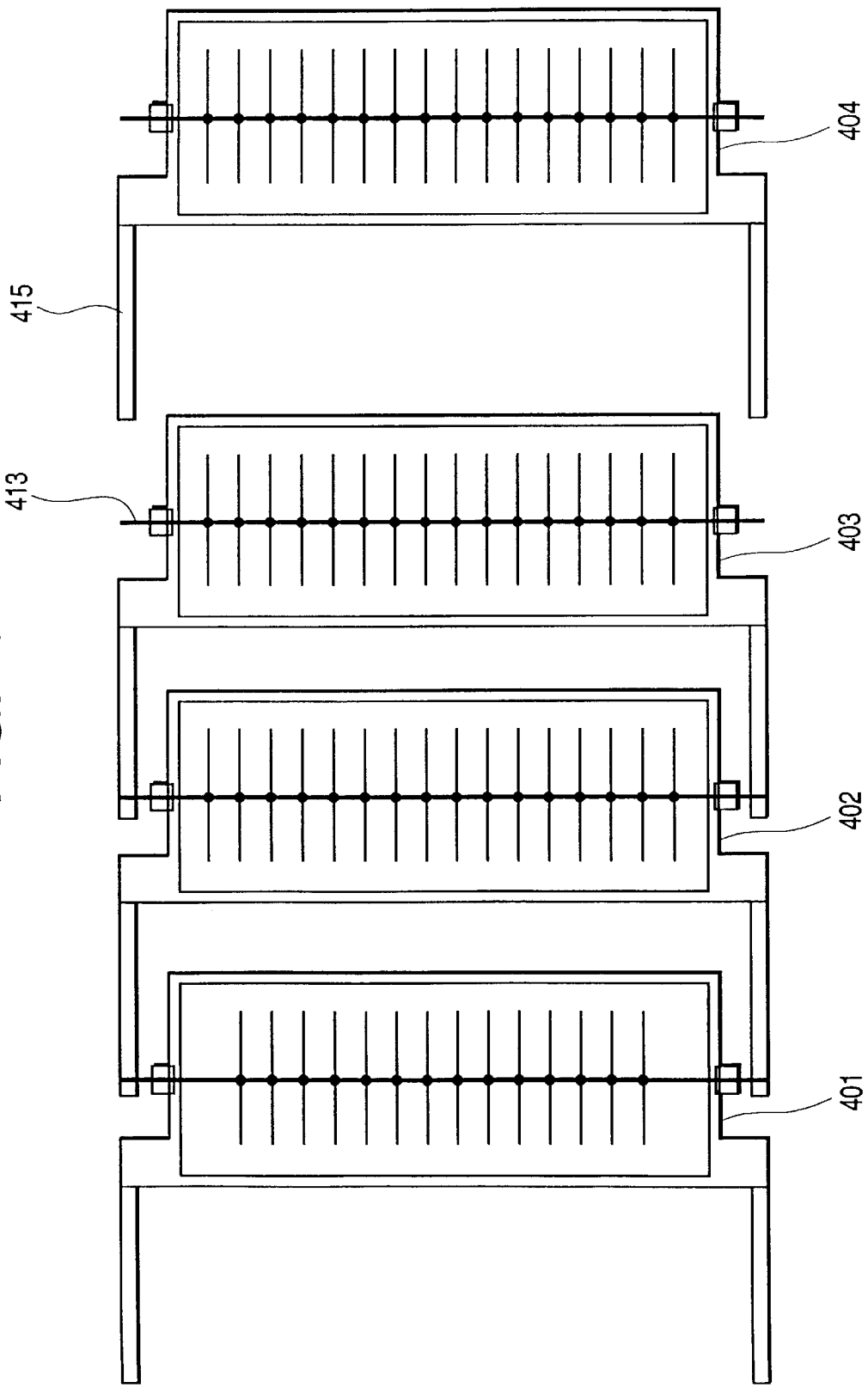
FIG. 4 is a schematic plan view showing the solar cell module of Example 1, and more specifically a schematic plan view showing the steps of Example 1 in which a plurality of photovoltaic elements are connected to each other.

Then the above solar cell strips were connected in series by soldering the tin-plated copper wire 413 of a solar cell strip 401 to the copper foil 415 of a solar cell strip 402 as illustrated in FIG. 4.

In the same manner, four solar cell strips 401, 402, 403, 404 were connected in series by similarly soldering the tin-plated copper wire 413 and copper foil 415 of each adjacent solar cell strip. Incidentally, wiring for the positive and negative terminals was effected on the back surface of the stainless substrate of each solar cell strip.

Then, lamination was carried out by successively stacking a GALVALUME steel sheet 601 of 0.4 mm in thickness/EVA (ethylene-vinyl acetate)/the above photovoltaic elements connected in series/EVA/a non-oriented fluororesin film "Aflex (available from Asahi Glass Co., Ltd.)" of an ethylenetetrafluoroethylene copolymer of 50 μm in thickness and melting the EVA sheets at 150° C. by a vacuum laminator, thereby making the solar cell module encapsulated with the weather-resistant resin.

Here, the GALVALUME steel sheet 601 was preliminarily bored to form two holes closely to each other for extraction of terminals. Incidentally, the bonding surface of the fluororesin film was preliminarily subjected to a plasma processing in order to enhance adhesion to the EVA 62. The photovoltaic elements connected in series were formed in the size slightly smaller than the GALVALUME steel sheet 601 of the back surface and the fluororesin film, because the edge portions of the solar cell module 107 were to be bent in a subsequent step. The tensile elongation of the fluororesin film used in this example was not less than 250%.

Figure 5:
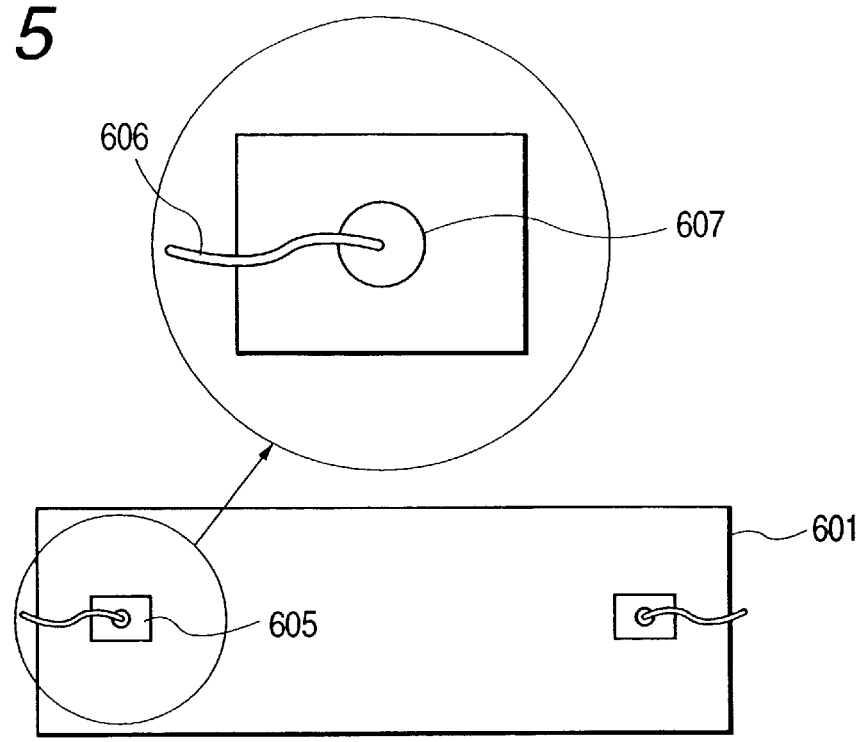
FIG. 5 is a schematic bottom plan view showing the solar cell module of Example 1.

Then, as illustrated in FIG. 5, wires 606 for the positive and negative terminals were exposed from the two terminal extraction holes 607 bored in the GALVALUME steel sheet 601 on the back surface of the solar cell module, and thereafter a terminal extraction box 605 was attached with an adhesive so as to cover the two terminal extraction holes 607. In this way, the solar cell module is connected to a junction box such as a terminal extraction box 605 or an inverter for controlling the output thereof to function as a photovoltaic power generating apparatus.

Figure 6:
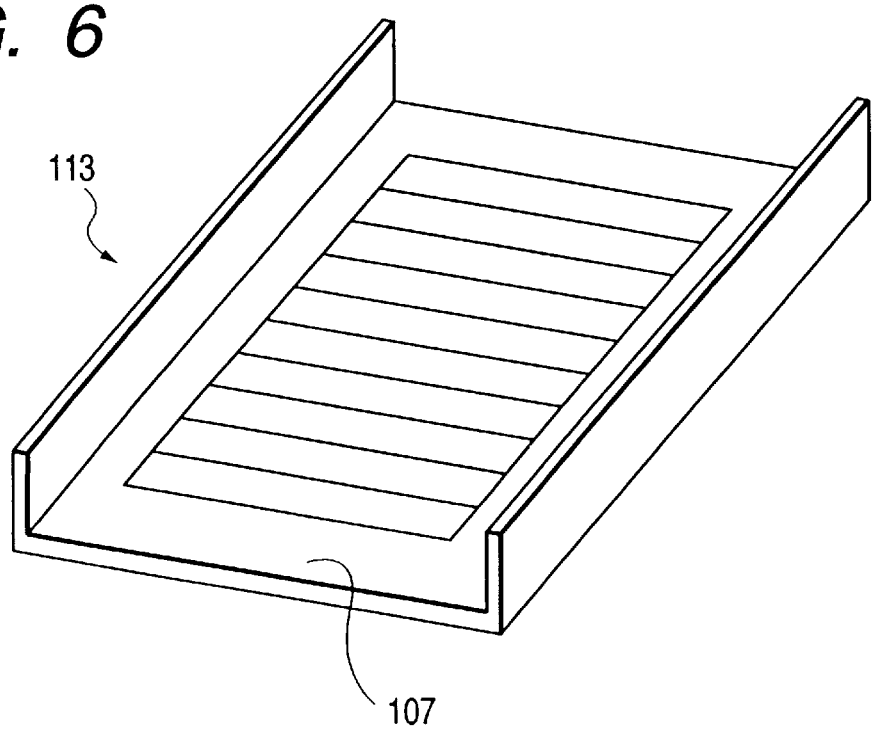
FIG. 6 is a schematic perspective view showing the roof integrated type solar cell module of Example 1.

Then the edges of this solar cell module 107 were bent upward by a bending machine as illustrated in FIG. 6, thereby forming the roofing material integrated solar cell module 113 of the batten seam type.

Figure 7:
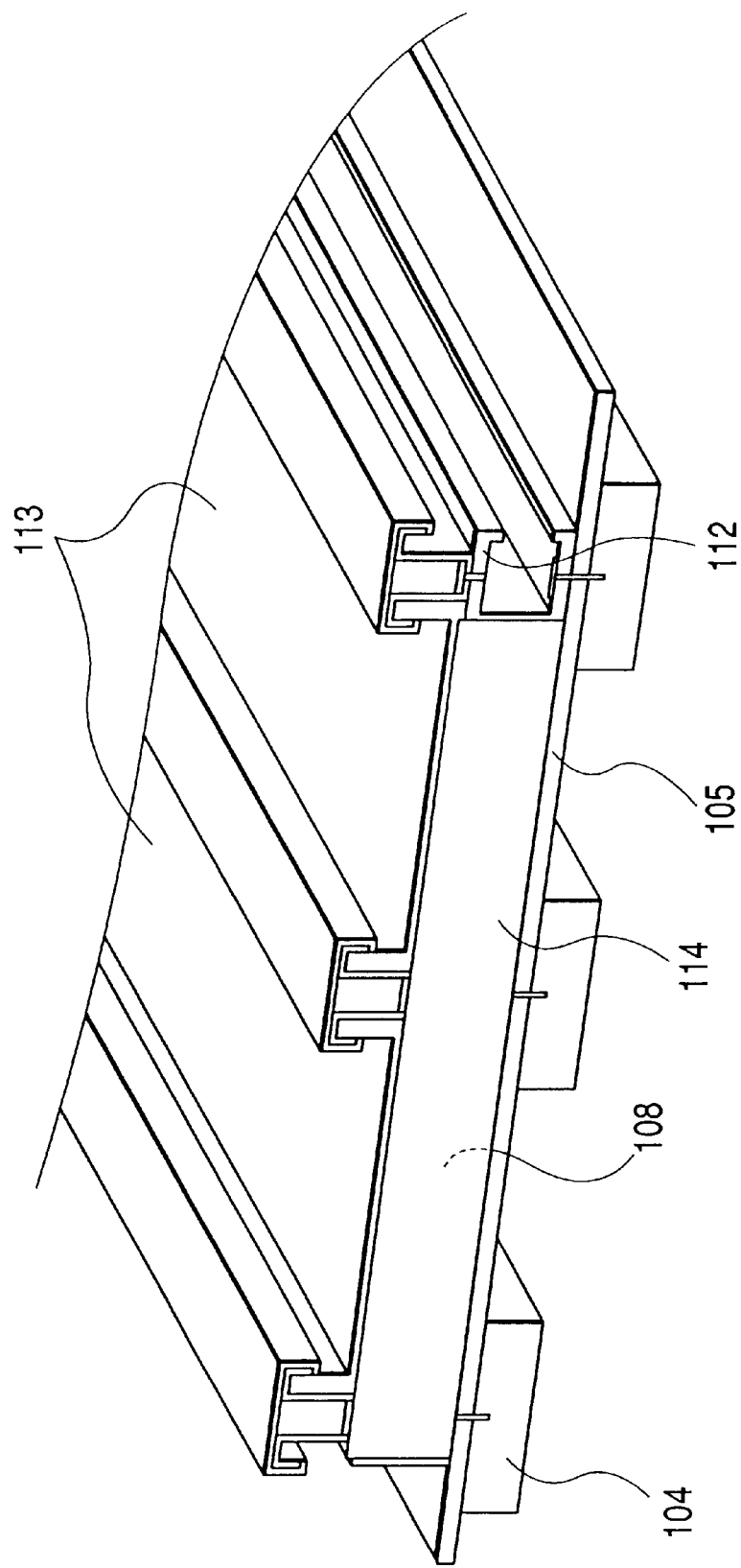
FIG. 7 is a schematic perspective view showing the photovoltaic power generating structure of Example 1.

Then, as illustrated in FIG. 7, the roofing material integrated solar cell module 113 was mounted to form a photovoltaic power generating structure. A base member 105 was laid on a rafter 104, and the roofing material integrated solar cell modules 113 of the batten seam type were mounted through spacer steel members 112 of the C shape thereon, thereby forming the roofing in a horizontal plane.

In this example, cemented excelsior boards (Cemented Excelsior Board Industrial Association, thermal conductivity=0.13 kcal/meter hour ° C.; Thickness 25 mm) were used as the base member 105. The spacing between the base member 105 and the roofing material integrated type solar cell modules 113 is set at 30 mm, and, in order to interrupt the communication between the space portion 108 and the air, the openings in the longitudinal direction were closed with the cover plate 114.

As a result, the thermal transmittance between the base member 105 and the roofing material integrated type solar cell modules 113 was 0.73 kcal/m² hour ° C. The relationships among the thickness of each portion, thermal conductivity, thermal resistance, and thermal transmittance of the other portions are listed in Table 1 below.

TABLE 1

|  | Material | Thickness mm | Thermal conductivity kcal/mh° C. | Thermal resistance m²h° C./kcal | Thermal transmittance kcal/m²h° C. | A: Total thermal resistance m²h° C./kcal | Thermal transmittance of A kcal/m²h° C. |
|---|---|---|---|---|---|---|---|
| Example 1 | 1) Outer surface | 5 | — | 0.050 | 20.0 | 1.364 | 0.73 |
|  | 2) PV | 0.91 | 0.28 | 0.003 | 307.7 | only 3) |  |
|  | 3) Stationary air | 30 | 0.022 | 1.364 | 0.7 |  |  |
|  | 4) Base member | 25 | 0.13 | 0.192 | 5.2 |  |  |
|  | 5) Inner surface | 5 | — | 0.100 | 10.0 |  |  |
| Comparative Example 1 | 1) Outer surface | 5 | — | 0.050 | 20.0 | 0.003 only 3) | 333.33 |
|  | 2) PV | 0.91 | 0.28 | 0.003 | 307.7 |  |  |
|  | 3) Moving air | 30 | 10 | 0.003 | 333.3 |  |  |
|  | 4) Base member | 25 | 0.13 | 0.192 | 5.2 |  |  |
|  | 5) Inner surface | 5 | — | 0.100 | 10.0 |  |  |
| Comparative Example 2 | 1) Outer surface | 5 | — | 0.050 | 20.0 | 1.071 only 3) | 0.93 |
|  | 2) PV | 0.91 | 0.28 | 0.003 | 307.7 |  |  |
|  | 3) Thermal insulating material | 30 | 0.028 | 1.071 | 0.9 |  |  |
|  | 4) Base member | 25 | 0.03 | 0.833 | 1.2 |  |  |
|  | 5) Inner surface | 5 | — | 0.100 | 10.0 |  |  |
| Comparative Example 3 | 1) Outer surface | 5 | — | 0.050 | 20.0 | 0.537 3) + 4) | 1.86 |
|  | 2) PV | 0.91 | 0.28 | 0.003 | 307.7 |  |  |
|  | 3) Thermal insulating material | 15 | 0.028 | 0.536 | 1.9 |  |  |
|  | 4) Moving air | 15 | 10 | 0.002 | 666.7 |  |  |
|  | 5) Base member | 25 | 0.03 | 0.833 | 1.2 |  |  |
|  | 6) Inner surface | 5 | — | 0.100 | 10.0 |  |  |
| Example 1 | 1) Outer surface | 5 | — | 0.050 | 20.0 | 1.556 3) + 4) | 0.64 |
|  | 2) PV | 0.91 | 0.28 | 0.003 | 307.7 |  |  |
|  | 3) Stationary air | 30 | 0.022 | 1.364 | 0.7 |  |  |
|  | 4) Base member | 25 | 0.13 | 0.192 | 5.2 |  |  |
|  | 5) Inner surface | 5 | — | 0.100 | 10.0 |  |  |

TABLE 1-continued

|  | Material | Thickness mm | Thermal conductivity kcal/mh° C. | Thermal resistance m²h° C./kcal | Thermal transmittance kcal/m²h° C. | A: Total thermal resistance m²h° C./kcal | Thermal transmittance of A kcal/m²h° C. |
|---|---|---|---|---|---|---|---|
| Example 8 | 1) Outer surface | 5 | — | 0.050 | 20.0 | 1.654 | 0.60 |
|  | 2) PV | 0.91 | 0.28 | 0.003 | 307.7 | 3) + 4) |  |
|  | 3) Stationary air | 30 | 0.022 | 1.364 | 0.7 |  |  |
|  | 4) Base member | 25 | 0.086 | 0.291 | 3.4 |  |  |
|  | 5) Inner surface | 5 | — | 0.100 | 10.0 |  |  |

Comparative Example 1

Figure 8:
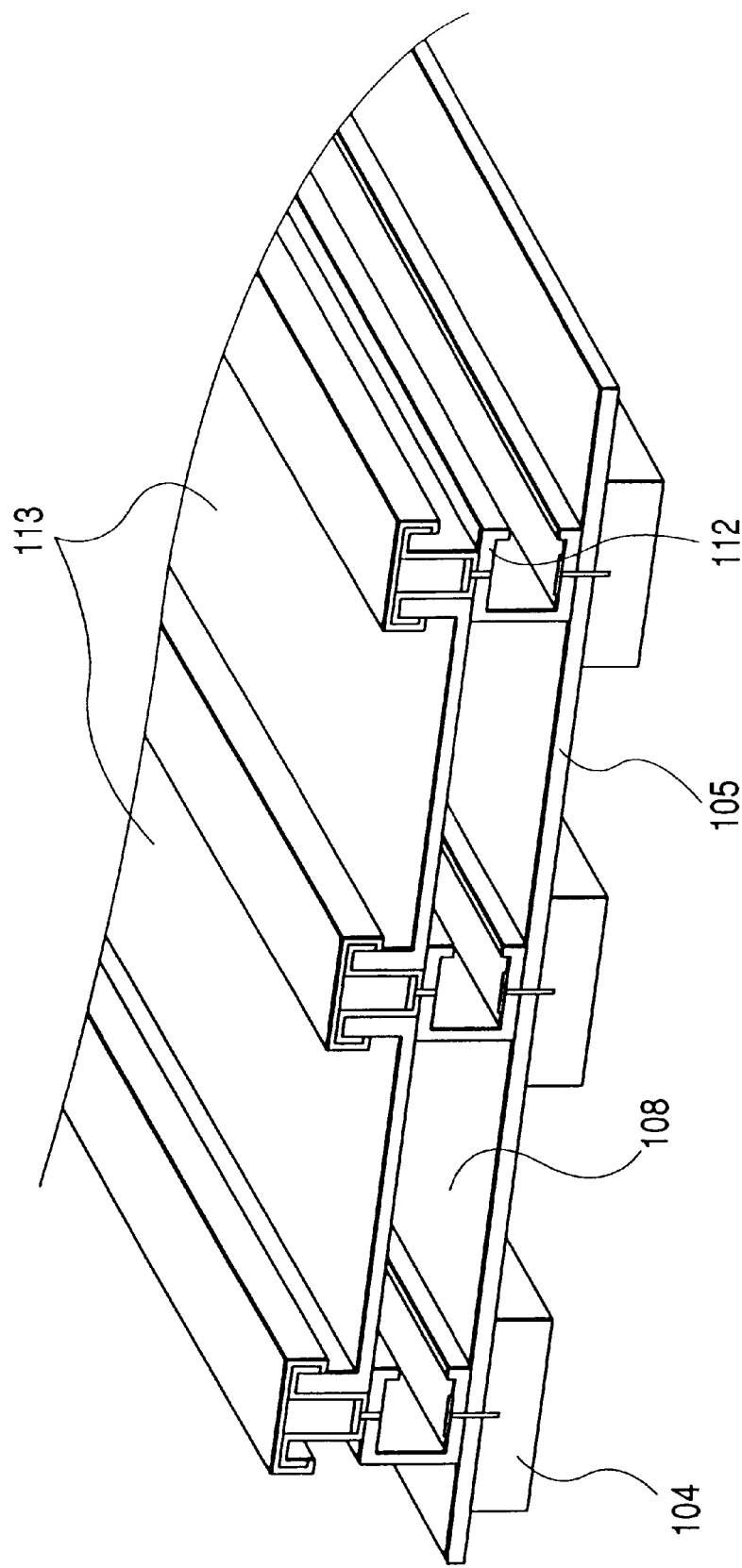
FIG. 8 is a schematic perspective view showing the photovoltaic power generating structure of Comparative Example 1.

In Comparative Example 1, the same roofing material integrated type solar cell modules 113 as Example 1 are arranged as shown in FIG. 8.

The gap between the base member 105 and the roofing material integrated type solar cell modules 113 was set at 30 mm. This Comparative Example 1 is different from Example 1 in that space portions 108 between the base member 105 and the roofing material integrated type solar cell modules 113 are left in communication with the air.

As a result, the thermal transmittance between the base member 105 and the roofing material integrated type solar cell modules 113 was 333.33 kcal/m² hour ° C. The relationships among the respective thicknesses, thermal conductivity, thermal resistance, and thermal transmittance are listed in Table 1.

In Example 1, the air circulation in space portions 108 is extremely low as compared to Comparative Example 1 and the thermal transmittance, extremely high. As a result, thermal loss in the space portions 108 becomes high, thus lowering the heat insulating property of the adjacent roofing material integrated solar cell modules 113. There are little differences in cost between the materials.

Comparative Example 2

Figure 9:
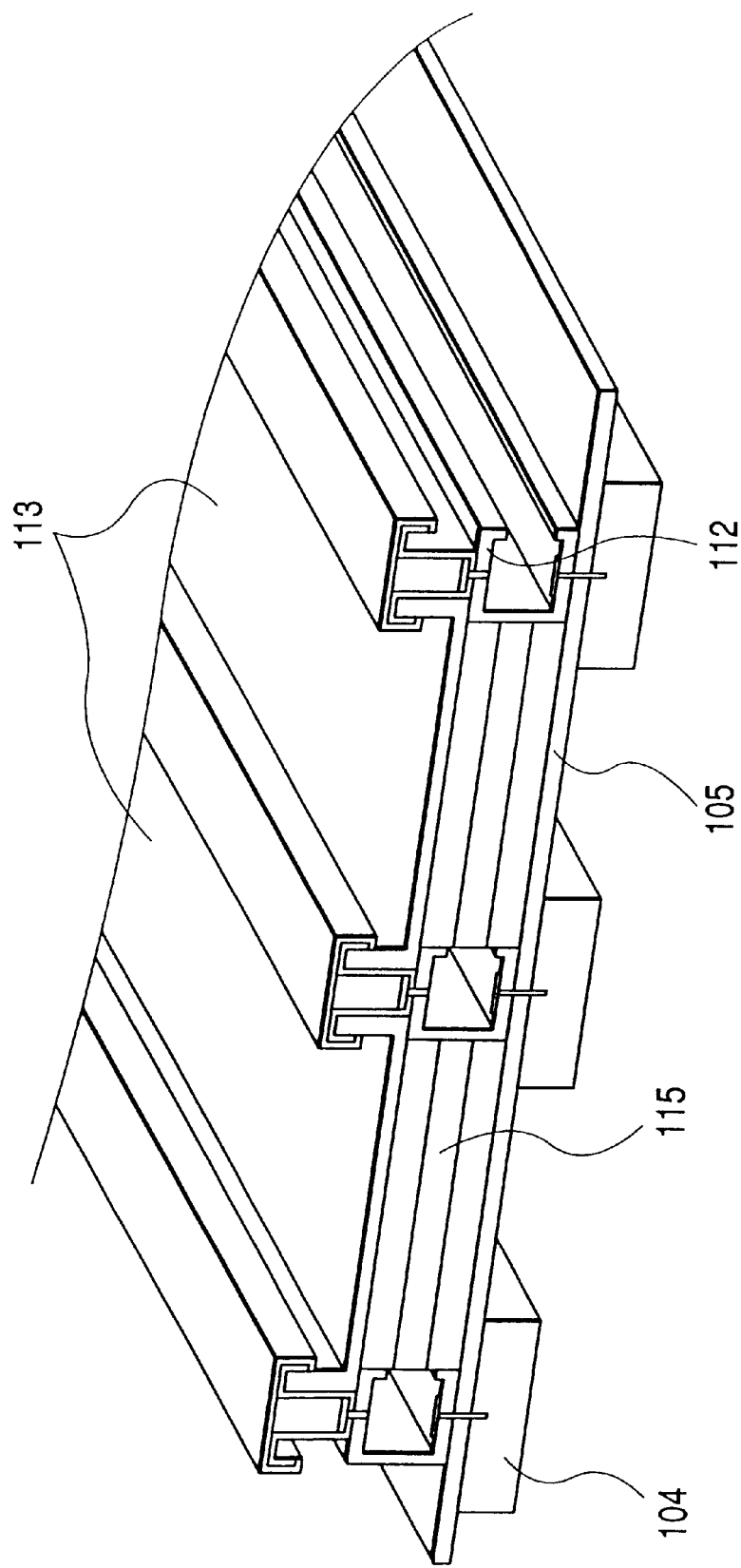
FIG. 9 is a schematic perspective view showing the photovoltaic power generating structure of Comparative Example 2.

In Comparative Example 2, the same roofing material integrated type solar cell modules 113 as Example 1 were arranged as shown in FIG. 9. The gap between a base member 105 and the roofing material integrated type solar cell modules 113 was set at 30 mm. This example is different from Example 1 in that a thermal insulating material (Ziefnen (trade name) available from Sekisui Chemical Co., Ltd., thermal conductivity=0.028 kcal/m² hour ° C., thickness =10 mm) was arranged in three layers as the underlaying material inside the space portions between the base member 105 and the roofing material integrated solar cell modules 113.

As a result, the thermal transmittance between the base member 105 and the roofing material integrated type solar cell modules 113 was 0.93 kcal/m² hour ° C. The relationships among the respective thicknesses, thermal conductivity, thermal resistance, and thermal transmittance of the other portions are listed in Table 1.

Since Comparative Example 2 has a little higher thermal transmittance than Example 1, it suffers from a little lower but not so much lower heat insulating property of the adjacent roofing material integrated type solar cell modules 113. However, as compared to zero material cost of the space portions in Example 1, Comparative Example 2 has costs both for the material for the thermal insulating material 115 and for the construction thereof. These costs are proportional to the construction area in the case of actual roofs.

Comparative Example 3

Figure 10:
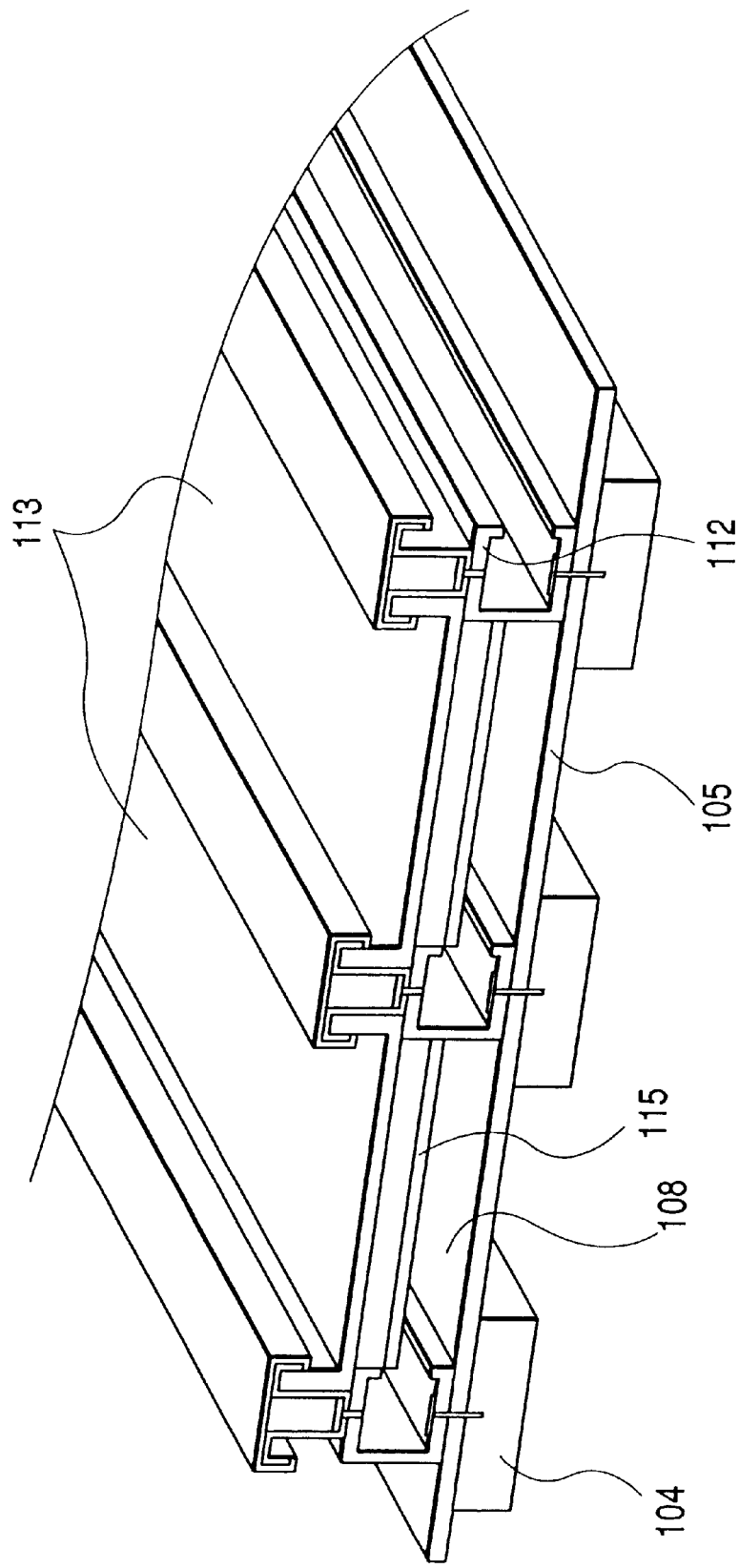
FIG. 10 is a schematic perspective view showing the photovoltaic power generating structure of Comparative Example 3.

In Comparative Example 3, the same roofing material integrated type solar cell modules 113 as Example 1 were arranged as shown in FIG. 10. The gap between the base member 105 and the roofing material integrated solar cell modules 113 was set at 30 mm. This example is different from Example 1 in that thermal insulating material 115 (Ziefnen (trade name) available from Sekisui Chemical Co., Ltd., thermal conductivity=0.028 kcal/m² hour ° C., thickness=10 mm+5 mm=total 15 mm), was bonded in two layers as the underlaying material to the non-light-receiving surface of the roofing material integrated type solar cell modules 113, to form space portions 108 with a thickness of 15 mm between the thermal insulating materials 115 and the base member 105. The space portions 108 are left in communication with the air.

As a result, the thermal transmittance between the base material 105 and the roofing material integrated type solar cell modules 113 was 1.86 kcal/m² hour ° C. The relationships among the respective thicknesses, thermal conductivity, thermal resistance, and thermal transmittance of the other portions are listed in Table 1.

Comparative Example 3 had a higher thermal transmittance than Example 1, as well as a thinner insulating material 115, which has a high thermal conductivity. Besides, Comparative Example 3 suffers from a cost for the thermal insulating materials 115 and a cost for their construction.

Example 2

Figure 11:
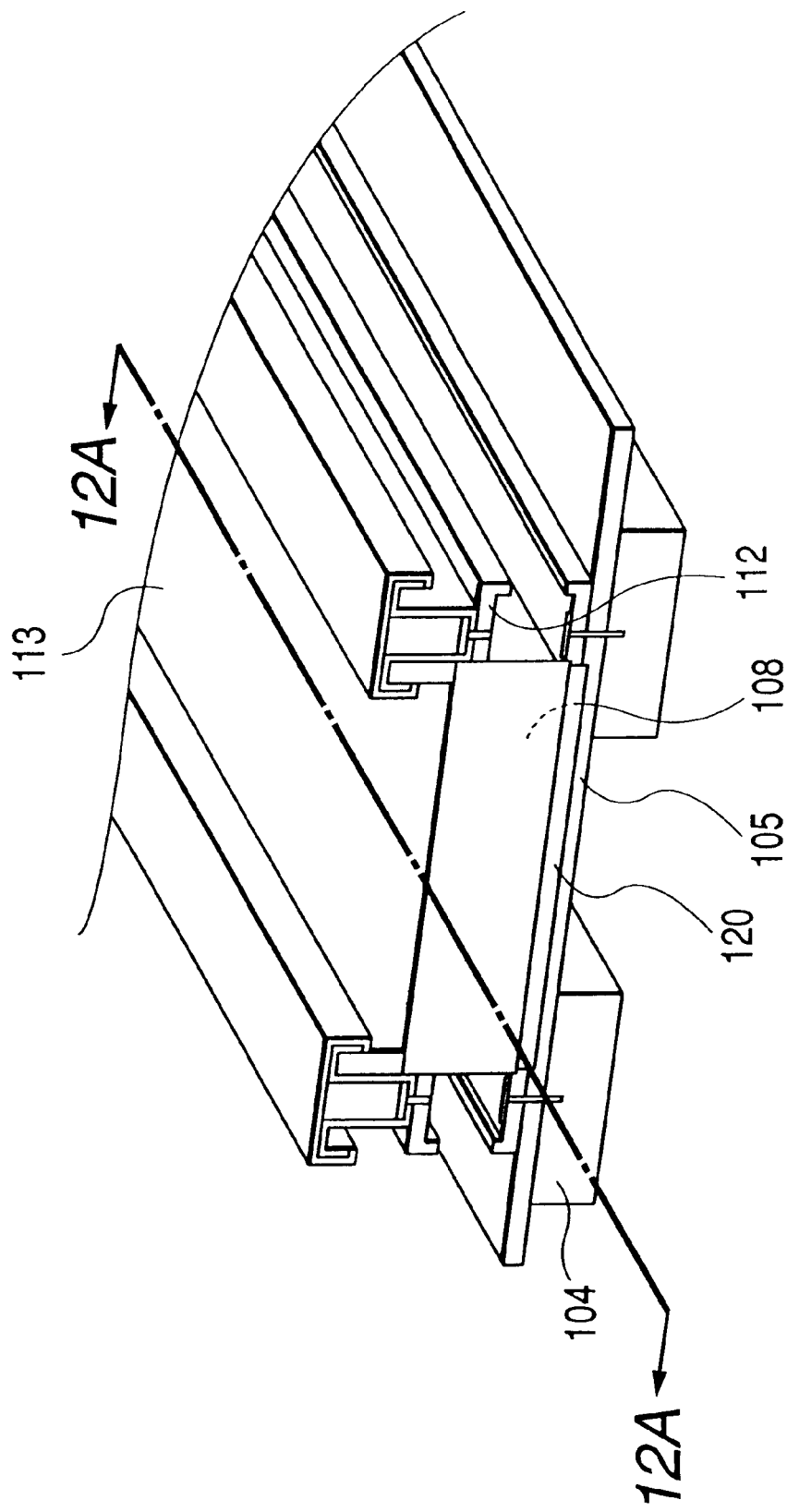
FIG. 11 is a schematic perspective view showing the photovoltaic power generating structure of Example 2.
Figure 12A:
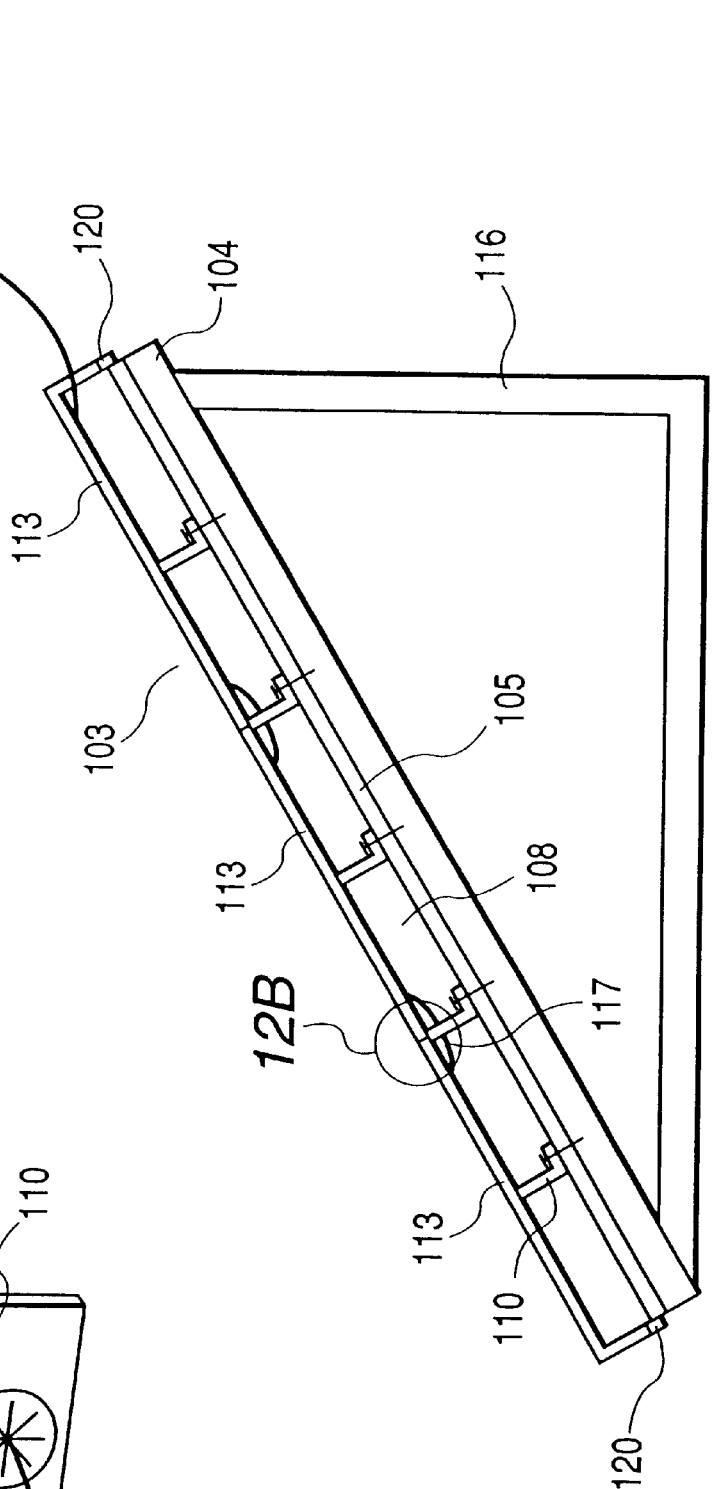
FIG. 12A is a schematic sectional view taken along the line 12A—12A of FIG. 11.
Figure 12B:
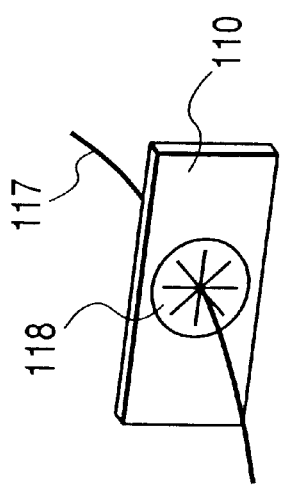
FIG. 12B is an enlarged perspective view showing the portion 12B of FIG. 12A.

In Example 2, the same roofing material integrated type solar cell modules 114 as Example 1 were constructed as shown in FIGS. 11, 12A and 12B. A stand 116 of ½ pitch was used to lay the base member 105 on rafters 104 and then three sheets, in series, of batten seam type roofing material integrated solar cell modules 113 (peripheral length: approx. 1.3 m) via a C-shape spacer steel member 112, to form a roof 103.

As the base member was used a cemented excelsior board (available from Cemented Excelsior Board Industry Association, thermal conductivity=0.13 kcal/m² hour ° C., thickness=25 mm). The gap between the base member 105 and the roofing material integrated type solar cell modules 113 was set at 30 mm; in order prevent the space portions 108 from communicating with the air, the upper and lower openings in the longitudinal direction were closed by folding, respectively, part of the upper short side of the top-stage modules 113 and the lower short side of the bottom-stage modules 113 and, moreover, the gap was sealed with a sealant 120. Inside the space portions 108 below each roofing material integrated type solar cell module 113, resin-molded convection controlling portions 110 in the direction of the purlins were fixed onto the base member 105 with drill screws, thus interrupting in construction the communication in the flow direction between the space portions.

The electrical connection between the roofing material integrated type solar cell modules 113 was carried out inside the space portions 108; an electrical connection wire 117 was allowed to pass through a bush 118 provided on convection controlling portions 110, and then to the outside and was connected to a power converter 701 and a commercial AC system 702 to provide a system interconnection system.

After the roof 103 was left outdoors for a certain period of time, the temperature distribution in the space portions 108 was measured at 12 points at equal intervals in the flow direction immediately below the solar cell modules 113. The relationship between the points in the flow direction and the temperature distribution is shown in FIG. 17. In FIG. 17, the numbers on the abscissa indicate the points in the flow direction of the roof at which the temperature measurement of the space was effected. Specifically, the number 1 indicates point 1 which is higher than the lower edge of the roof 103 by 1/12 of the length in the flow direction of the roof 103. Similarly, the number 2 indicates point 2 which is higher than point 1 by 1/12 of the length in the flow direction of the roof 103. Thus, the number 12 indicates a point in the space portion 108 immediately below the upper edge of the uppermost solar cell module 113.

Example 3

Figure 13:
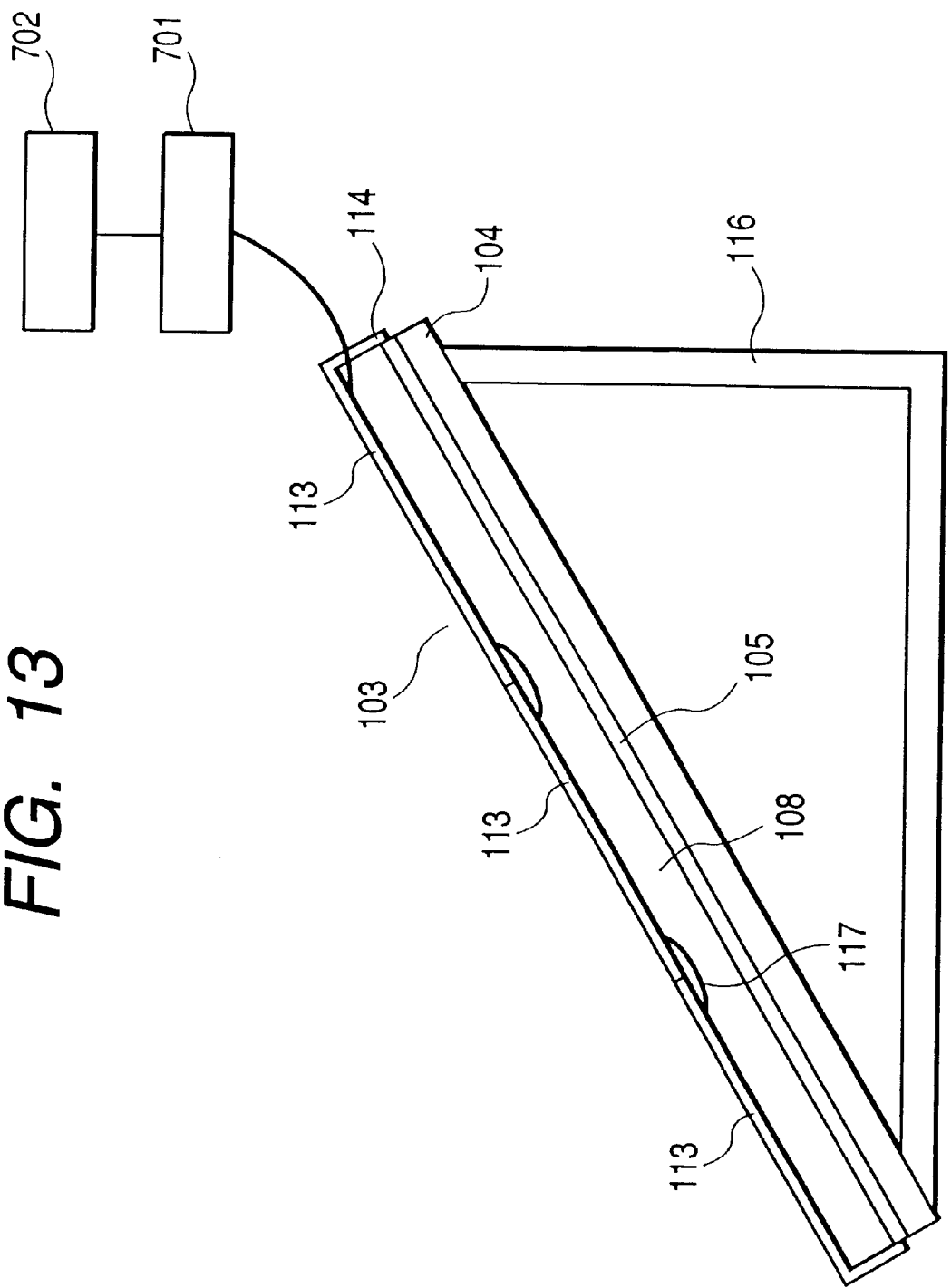
FIG. 13 is a schematic sectional view showing the photovoltaic power generating structure of Example 3.

In Example 3, the same roofing material integrated type solar cell modules 113 as Example 2 were arranged as shown in FIG. 13. This Example is different from Example 2 in that no convection controlling portion was installed inside the closed space portions 108 below each roofing material integrated type solar cell module 113 and the spaces below the three sheets of roofing material integrated type solar cell modules 113 are allowed to communicate with each other when constructed. Reference numeral 114 designates covering plates.

After the roof 103 was left outdoors for a certain period of time, the temperature distribution in the thermal insulating space portion 108 was measured in the same manner as in Example 2. The relationship between the points in the flow direction and the temperature distribution is shown in FIG. 17. As compared to Example 2, Example 3 exhibited larger unevenness in temperature between the roofing material integrated type solar cell modules 113 and a lower average temperature.

Example 4

In Example 4, the same roofing material integrated solar cell modules as Example 2 were arranged. This example is different from Example 2 in that convection controlling portions were used which were formed by folding GAL-VALUME steel sheets.

As a result, each space portion was partitioned with a noncombustible material, thereby improving the fire-resistant effect.

Example 5

Figure 14:
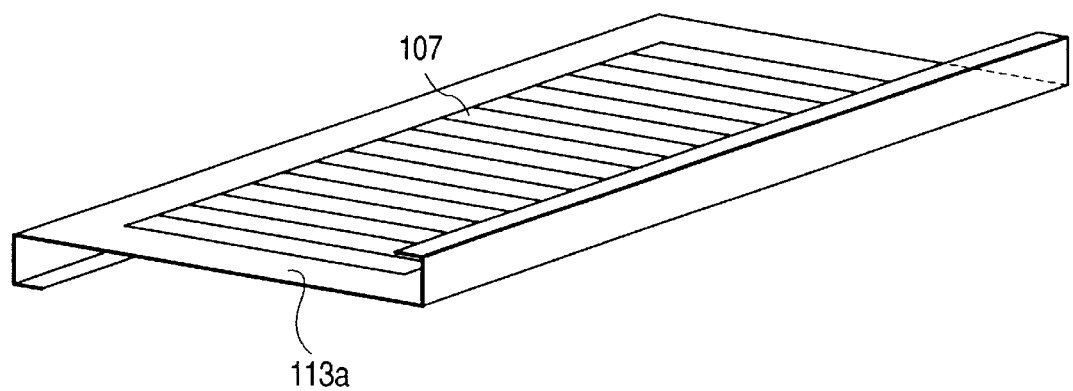
FIG. 14 is a schematic perspective view showing the roof integrated type solar cell module of Example 5.

In Example 5, the same solar cell modules 107 as Example 1 were transformed into the lateral roofing form with a folding machine as shown in FIG. 14, to produce roofing material integrated type solar cell modules 113a of the lateral roofing type.

Then, as shown in FIG. 15, the roofing material integrated type solar cell modules 113a were mounted. On the rafters 104 was laid a base member 105, on which was formed a horizontal roof 103 on which were arranged three sheets of the lateral roofing type, and roofing material integrated type solar cell modules 113a using clips 119. The seam joint was carried out to combine the roofing material integrated solar cell modules 113a.

As the base member 105 were employed cemented excelsior boards (available from Cemented Excelsior Board Industrial Association, thermal conductivity=0.13 kcal/m² hour ° C., thickness=25 mm). The space portions 108 between the base member 105 and the roofing material integrated type solar cell modules 113a were covered with a bargeboard 121 at their horizontal openings to interrupt communication with the air and, moreover, the gap between the bargeboard 121 and the roofing material integrated type solar cell modules 113a was sealed with a silicone sealant 122.

Furthermore, the portions without clips 119 were mounted with a sealant 120, to interrupt communication between the thermal insulating space portions 108 in construction. It should be noted that no sealant material 120 is necessary when long-measuring clips are used as the clips 119.

The electrical connection between the roofing material integrated solar cell modules 113a was carried out by permitting electrical connecting wires 117 to pass through bushes 118 provided at cover plates 114.

As a result, by the contact of the seam joint portions with the base member 105, or by means of the clips 119 or sealant 120, the seam joint portions serve as the convection suppressing plates of Example 2, so that the effect similar to that of Example 2 can be obtained.

When the example is compared with Example 2 different in construction method, the volume of the space 108 is smaller, the heat transmission coefficient is higher, and the effect is smaller, but the example has a smaller heat transmission coefficient than the conventional art.

Example 6

In Example 6, solar cell modules 107 similar to that of Example 1 were worked into the lateral roofing form with a folding machine to prepare solar cell modules 113a integral with the roof material. As shown in FIG. 16, the solar cell module 113a integral with the roof material was mounted. Laid on the rafters 104 was the base member 105, on which three lateral roofing type, roofing material integrated type solar cell modules 113a were installed so that a roof 103 was formed in a horizontal plane.

As the base member 105, an excelsior cement plate (Excelsior Cement Plate Industry Association, thermal conductivity=0.13 kcal/m²h° C., thickness of 25 mm) was used. In order to shut off the connection of the space 108 of the base member 105 and solar cell module 113a integral with the roofing material with the open air, left-to-right openings were covered with gable covering plates 124, and gaps of the gable covering plates 124 and solar cell module 113a integral with the roof material were further sealed with EPT Sealer (trade name of a sealing material available from NITTO DENKO CORP.) 123.

The example is different from Example 4 in that lateral roofing without use of any clip is carried out, the construction can be performed only by seam-jointing the solar cell modules 113a integral with the roof material, and no clip is necessary.

As a result, when the seam joint abuts on the base member 105, or when the solar cell modules 113a integral with the roof material abut on one another in a width direction in the seam joint, so that the seam joint portions serve as the convection suppressing plate of Example 2, the effect similar to that of Example 2 can be obtained simply by such construction without using other members.

Example 7

In Example 7, the solar cell module integral with the roof material was constructed in the same manner as Example 5. Laid on the rafters was a roof sheathing, on which an underlaying material slightly longer than the width of the solar cell module integral with the roof material was laid. Thereafter, clips were used to fix three lateral roofing type, roofing material integrated type solar cell modules, so that a roof was formed in a horizontal plane. Modules were assembled by seam jointing. As the base member, 22 kg of asphalt roofing (surface softening point of about 80° C.) was used.

For the underlaying material, since the temperature of the solar cell module integral with the roof material rises almost to 90° C. in extremely hot weather, the softening point is preferably 90° C. or less, more preferably in the range of 40° C. to 90° C. When the asphalt roofing is used, an excellent closed space can be obtained.

To shut off the communication of the spaces of the underlaying material and the solar cell modules integral with the roof material with the outside air, the left-to-right openings were sealed by folding the solar cell modules integral with the roof material in its longitudinal direction and placing the folded portion in contact with the longer size underlaying material prepared beforehand.

When the roof of the example is placed in an extremely hot environment, the asphalt roofing is softened, and each member sinks in the asphalt roofing. As a result, sealing properties of the seam joint portions and roof sheathing at contact faces are enhanced. Moreover, since no special member needs to be used, construction can be performed at low costs.

Example 8

In Example 8, the solar cell modules integral with the roof material were installed in the same manner as Example 1. The interval between the base member and the solar cell module integral with the roof material was set to 30 mm.

The example is different from Example 1 in that Tie-ace (Unicharm Corp., thermal conductivity=0.086 kcal/m² h° C., thickness of 25 mm) was used as the base member.

As a result, the total thermal transmittance of the base member and the space portion was 0.6 kcal/m²h° C. The relationship of the respective thicknesses, thermal conductivity, thermal resistance, and thermal transmittance is shown in Table 1.

In Example 1 the total thermal transmittance in the base member and space portion was 0.64 kcal/m²h° C. On the other hand, in this example the thermal transmittance is low, and thermal insulating properties to the adjacent solar cell module integral with the roof material are enhanced.

As described above in detail, according to the present invention, the solar cell module is provided on the base member, and the thermal insulating space for shutting off the communication with the outside air is formed between the base member and the solar cell modules. Therefore, the air inside the thermal insulating space is close to a stationary state. Since the stationary air has a remarkably low thermal transmittance, heat radiation from the lower surface of the solar cell modules is prevented. When an amorphous semiconductor is used in the solar cell module, a sufficient annealing effect can be obtained. Moreover, even when the base member or underlaying material is excessively heated with fire or the like, the fire can be suppressed, and the fire can be prevented from spreading.

Moreover, since the thermal transmittance becomes lower as compared with a case where the thermal insulating material having the equal thickness is used, the annealing effect can be increased.

Furthermore, since the thermal insulating space is not in communication with the outside air, the force of wind blowing upward from below does not act on the solar cell modules, and attachment of high-strength solar cell modules does not need to be designed in consideration of strong wind or the like.

Here, the space portion between the base member and the solar cell modules is divided and formed by the convection suppressing portion. When the spaces are not in communication with one another, the convection inside the space is suppressed. Therefore, temperature unevenness between individual solar cell modules is reduced. Output fluctuation, light degradation and annealing effect nonuniformity are lowered. The total output as a solar power generation system can be prevented from being lowered. The more space divisions there are, the more the effect is obtained.

Moreover, when the convection suppressing portions are arranged in the purlin direction, and the communication of the spaces is shut off in the flow direction, warmed air in the space is prevented from flowing (convecting) to the ridge, and the effect is further heightened. Furthermore, the communication of the spaces is shut off by a plurality of convection suppressing portions. Therefore, even when some of the convection suppressing portions are collapsed by fire or the like, the convection is suppressed by the other convection suppressing portions, and the fire can be prevented from spreading.

Additionally, when the convection suppressing portions are formed of a noncombustible material, the individual spaces are partitioned by the noncombustible material. Therefore, the effect of preventing the fire from spreading is heightened. When the under surface of the solar cell module is of a noncombustible material, the effect is further increased.

Moreover, when the solar cell module is of the lateral roofing type, the seam joint portions extended in the purlin direction abut on the roof base member to serve as the convection suppressing portion. When the base member with a low softening point is used in the roof base member, the effect is further heightened. Therefore, when usual roof construction is performed without using other members, a structure in which the communication of the spaces in the flow direction is shut off can be realized.

Additionally, when the base member of underlaying material superior in thermal insulating properties is used, the thermal transmittance of the space portion and base member is further lowered. Therefore, the heat radiation from the lower surface of the solar cell modules is prevented, and the temperature inside the space portion is raised. As a result, the annealing effect can be enhanced.

Consequently, according to the present invention, there can be provided a solar power generation structure which can be easily constructed and installed at a low cost, can maintain an excellent output as the solar power generation system, is superior in environmental resistance, and can also enhance fire resistance.

What is claimed is:

1. A photovoltaic power generating apparatus comprising:
   (a) a solar cell module for mounting on a roof base member, and
   (b) convection controlling means made of a non-combustible material for forming a closed thermal insulating space portion cut off from air flow with the roof base member.

2. The photovoltaic power generating apparatus according to claim 1, wherein the convection controlling means also functions as a fixture for fixing the solar cell module.

3. The photovoltaic power generating apparatus according to claim 1, wherein the solar cell module is a lateral roofing solar cell module.

4. The photovoltaic power generating apparatus according to claim 1, wherein the solar cell module is formed as a roofing material integrated solar cell module.

5. The photovoltaic power generating apparatus according to claim 1, wherein the solar cell module is formed of an amorphous silicon based semiconductor.

6. The photovoltaic power generating apparatus according to claim 1, wherein the solar cell module is connected to an inverter for controlling the output or to a junction box.

7. A photovoltaic power generating structure comprising:
   (a) a solar cell module arranged on a roof base member,
   (b) convection controlling means made of a non-combustible material for forming a closed thermal insulating space portion cut off from air flow provided between the roof base member and the solar cell module, and
   (c) an underlaying material provided on the roof base member.

8. The photovoltaic power generating structure according to claim 7, wherein the convection controlling means is disposed in the direction of a purlin.

9. The photovoltaic power generating structure according to claim 7, wherein the underlaying material is a material having a softening point of 40 to 90° C.

10. The photovoltaic power generating structure according to claim 7, wherein the roof base member comprises a thermal insulating material.

11. The photovoltaic power generating structure according to claim 7, comprising a non-power-generating roof portion in addition to the solar cell module.

12. The photovoltaic power generating structure according to claim 1, wherein longitudinal ends of the convection controlling portion are closed with a plate member.

13. A photovoltaic power generating structure comprising:
   (a) a plurality of solar cell modules arranged on a roof base member,
   (b) a plurality of convection controlling portions made of a noncombustible material spacedly arranged in parallel in a direction perpendicular to a direction of air flow, each convection controlling portion extending between said solar cell modules and said roof base member, and
   (c) a plate member for closing longitudinal ends of the plurality of convection controlling portions,
   whereby a plurality of space portions are defined by the combination of said solar cell modules, said convection controlling portions and said plate member, and whereby said plurality of space portions constitute a thermal insulating space portion cut off from air flow.

14. The photovoltaic power generating structure according to claim 13, wherein the plurality of space portions are separate from one another.

15. The photovoltaic power generating structure according to claim 13, wherein the convection controlling portions also function as fixtures for fixing the solar cell modules.

16. The photovoltaic power generating structure according to claim 13, wherein the solar cell modules are lateral roofing solar cell modules.

17. The photovoltaic power generating structure according to claim 13, wherein the solar cell modules are formed as roofing material integrated solar cell modules.

18. The photovoltaic power generating structure according to claim 13, comprising a non-power-generating roof portion in addition to the solar cell modules.

19. The photovoltaic power generating structure according to claim 13, wherein the solar cell modules are formed of an amorphous silicon based semiconductor.

20. The photovoltaic power generating structure according to claim 13, wherein the solar cell modules are connected to an inverter for controlling the output or to a junction box.

21. The photovoltaic power generating structure according to claim 13, further comprising an underlaying material provided on the roof base member.

22. The photovoltaic power generating structure according to claim 21, wherein the underlaying material is a material having a softening point of 40 to 90° C.

23. The photovoltaic power generating structure according to claim 21, further comprising means for retaining the plurality of solar cell modules to the underlaying material.

24. The photovoltaic power generating structure according to claim 23, wherein the thermal insulating space portion is enclosed by the underlaying material, the solar cells, the retaining means and the convection controlling portions.

25. A photovoltaic power generating structure comprising a solar cell module arranged on a roof base member, the solar cell module being fixed to the roof base member with a fixing member, wherein the roof base member, the solar cell module and the fixing member form a thermal insulating space portion cut off from air flow, and wherein the thermal insulating space portion is partitioned by a convection controlling portion made of a noncombustible material into a plurality of spaces.

26. The photovoltaic power generating structure according to claim 25, wherein longitudinal ends of the convection controlling portion are closed with a plate member.

27. A photovoltaic power generating structure comprising a plurality of solar cell modules arranged on a roof base member, wherein the roof base member and the plurality of solar cell modules form a thermal insulating space portion cut off from air flow, and wherein the thermal insulating space portion is partitioned by a convection controlling portion made of noncombustible material into a plurality of spaces.

28. The photovoltaic power generating structure according to claim 27, wherein longitudinal ends of the convection controlling portion are closed with a plate member.

* * * * *

UNITED STATES PATENT AND TRADEMARK OFFICE
CERTIFICATE OF CORRECTION

PATENT NO. : 6,800,801 B2
DATED : October 5, 2004
INVENTOR(S) : Sasaoka et al.

It is certified that error appears in the above-identified patent and that said Letters Patent is hereby corrected as shown below:

<u>Title page,</u>
Item [*] Notice, insert -- Subject to any disclaimer, the term of this patent is extended or adjusted under 35 U.S.C. 154(b) by 0 days. --

Signed and Sealed this

Nineteenth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,800,801 B2
DATED : October 5, 2004
INVENTOR(S) : Makoto Sasaoka et al.

It is certified that error appears in the above-identified patent and that said Letters Patent is hereby corrected as shown below:

Column 10,
Line 58, "part-beneath" should read -- part beneath --.

Column 14,
Line 58, "order" should read -- order to --.

Column 15,
Line 8, "110," should read -- 110 --.

Column 19,
Line 3, "for mounting" should read -- provided --.
Line 6, "for forming" should read -- provided between said solar cell module and said roof base member, wherein --.
Line 7, "with the" should read -- is defined by the combination of said solar cell module, said roof base member and said convection controlling means. --.
Line 8, "roof base member." should be deleted.
Line 27, "for forming" should read -- provided between said solar cell module and said roof base member, wherein --.
Line 28, "provided" should read -- is defined by the combination of said solar cell module, said roof base member and said convection controlling means, --.
Line 29, "between the roof base member and the solar cell" should be deleted.
Line 30, "module," should be deleted.
Line 48, "portion" should read -- means --.

Signed and Sealed this

Third Day of January, 2006

JON W. DUDAS
*Director of the United States Patent and Trademark Office*